US008325942B2

(12) United States Patent
Kuhr et al.

(10) Patent No.: US 8,325,942 B2
(45) Date of Patent: Dec. 4, 2012

(54) VOLUME CONTROL UNIT

(75) Inventors: Markus Kuhr, Singapore (SG); Lars Milde, Hannover (DE); Joachim Scholz, Hambuhren (DE)

(73) Assignee: Sennheiser electronic GmbH & Co., Wedemark (DE)

( * ) Notice: Subject to any disclaimer, the term of this patent is extended or adjusted under 35 U.S.C. 154(b) by 904 days.

(21) Appl. No.: 12/294,219

(22) PCT Filed: Mar. 24, 2006

(86) PCT No.: PCT/EP2006/061037

§ 371 (c)(1),
(2), (4) Date: Feb. 12, 2009

(87) PCT Pub. No.: WO2007/110108

PCT Pub. Date: Oct. 4, 2007

(65) Prior Publication Data

US 2009/0147971 A1 Jun. 11, 2009

(51) Int. Cl.
*H03G 3/00* (2006.01)

(52) U.S. Cl. ........................................ 381/109; 381/104

(58) Field of Classification Search .................. 381/104, 381/109

See application file for complete search history.

(56) References Cited

U.S. PATENT DOCUMENTS

| | | | | |
|---|---|---|---|---|
| 2,846,521 | A * | 8/1958 | Beidler | 381/374 |
| 2,989,598 | A * | 6/1961 | Touger et al. | 181/206 |
| 3,952,978 | A * | 4/1976 | Reinitz | 246/477 |
| 4,668,842 | A | 5/1987 | Yokoyama et al. | |
| 7,831,054 | B2 * | 11/2010 | Ball et al. | 381/104 |
| 2005/0178644 | A1 | 8/2005 | Moller | |
| 2007/0029710 | A1 * | 2/2007 | Takeuchi et al. | 267/64.27 |

FOREIGN PATENT DOCUMENTS

| | | | |
|---|---|---|---|
| DE | 1 742 855 | | 4/1957 |
| DE | 33 43 492 | A1 | 6/1984 |
| DE | 34 20 297 | A1 | 12/1984 |
| DE | 197 20 396 | A1 | 11/1997 |
| DE | 296 21 977 | U1 | 1/1998 |
| DE | 198 10 582 | A1 | 9/1998 |
| DE | 201 21 249 | U1 | 8/2002 |
| DE | 699 12 289 | T2 | 8/2004 |
| DE | 102004010198 | A1 | 9/2005 |
| EP | 0 825 796 | A2 | 2/1998 |
| EP | 1 058 479 | A2 | 12/2000 |
| EP | 1 250 025 | A1 | 10/2002 |
| GB | 2 103 902 | A | 2/1983 |
| JP | 10098792 | A | 4/1998 |
| JP | 10327492 | A | 12/1998 |
| JP | 2005252475 | A | 9/2005 |

* cited by examiner

*Primary Examiner* — Thanh V Pham

(74) *Attorney, Agent, or Firm* — Kilpatrick Townsend & Stockton LLP

(57) ABSTRACT

A phone, particularly an ear phone, is provided that features two transducer housings (41, 42) and a flexible head strap (43). The head strap (43) is pre-shaped in such a way that it is coiled up and has at least one turn in its relaxed and unworn state. In this way, the phone can be stowed in a space-saving fashion when it is not worn.

4 Claims, 24 Drawing Sheets

FIG. 5h
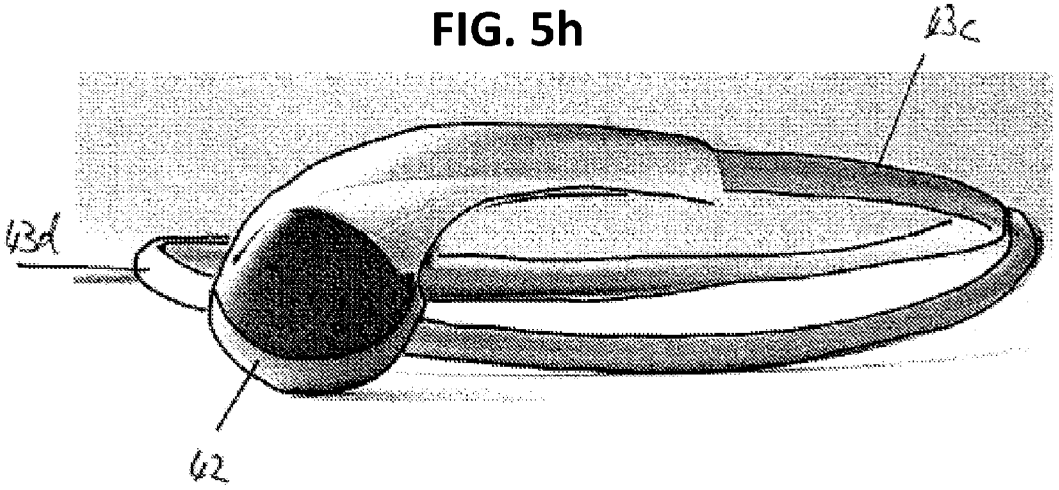
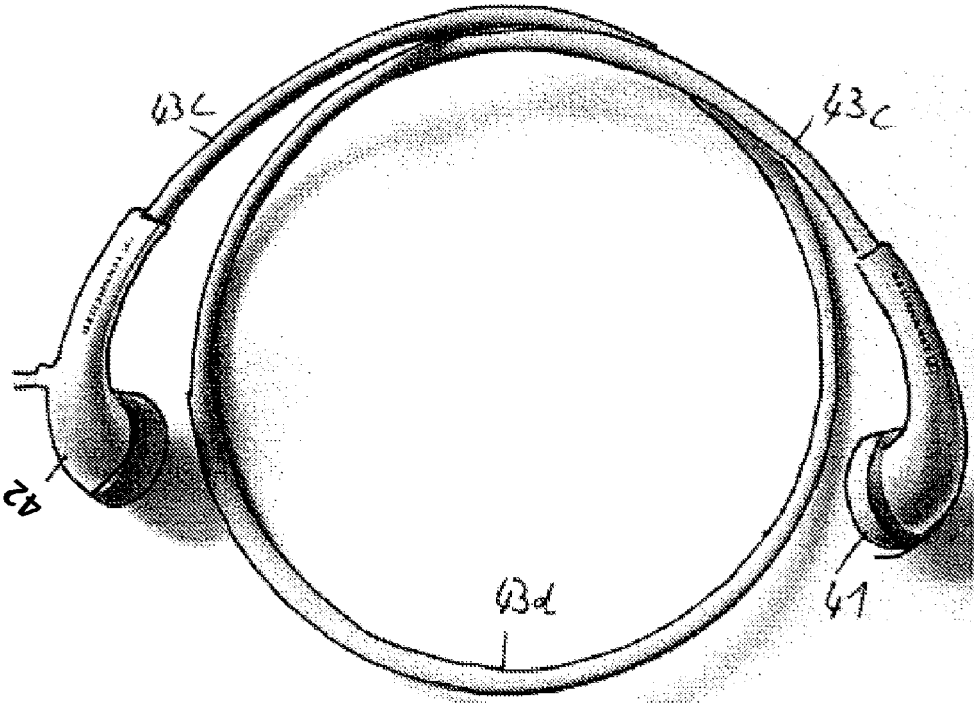
FIG. 5i

VOLUME CONTROL UNIT

CROSS-REFERENCES TO RELATED APPLICATIONS

This application is a U.S. National Stage of PCT/EP2006/061037 filed Mar. 24, 2006, the contents of which is incorporated herein by reference.

The present invention pertains to a phone, particularly an ear phone, as well as to a volume control unit for a phone.

Phones and ear phones are sufficiently known in many different variations. However, such head phones are frequently perceived as being excessively heavy and frequently do not provide the required wearing comfort, particularly during physical activities.

There also exist so-called in-ear phones that can be inserted into the outer ear and are then more or less firmly seated on the outer ear. Such in-ear phones are perceived as being uncomfortable by some persons, for example, because they can lead to pressure points in the outer ear or because they can fall out of the ears of some persons.

EP 1 250 025 A1 describes a neck band ear phone, the neck band of which is at least partially coiled up when it is not worn. In the worn state, the neck band presses against the back of the head of the person wearing the ear phone. The neck band extends from the transducer housing over the upper ear root and rests against the back of the head in the worn state. However, such a design of a neck band ear phone is not suitable, in particular, for persons who wear spectacles.

The present invention therefore is based on the objective of providing a phone that can be comfortably and safely worn.

This objective is attained with a phone according to Claim 1.

The invention therefore proposes a phone, particularly an ear phone, that features two transducer housings and a flexible head strap. The head strap is pre-shaped in such a way that it is coiled up and has at least one turn in its relaxed and unworn state. The phone therefore can be stowed in a space-saving fashion when it is not worn.

According to one aspect of the present invention, the head strap features two first sections that are respectively connected to the transducer housing and a second section that connects the two first sections. In the worn state of the phone, the two first sections essentially extend upward and parallel to the lateral head sections of the wearer. In the transition areas between the first sections and the second section, the head strap features a bend toward the back of the head. The second section is in the worn state essentially adapted to the transition between the head and the back of the head and also features a bend that essentially adapts itself to the head of the wearer.

The invention also pertains to an ear adapter ring for an ear phone. The ear adapter ring is fixed on the transducer housing of a phone. The adapter ring essentially features a first round recess that is arranged in the center of the ring. In addition, the ear adapter ring features recesses or grooves that in part extend radially from the outer edge toward the first recess.

The invention furthermore pertains to a volume control unit for a phone. The control unit features an outer tube unit with at least one opening and an inner tube unit with a first and a second end, as well as a longitudinal slot. The control unit furthermore features a potentiometer unit with a projection on its upper side, as well as a counterpart with at least one projection. The projection of the counterpart is realized in such a way that it can engage into the opening in the outer tube. The outer tube unit is pushed over the inner tube unit and the projection is inserted into the opening of the outer tube unit in such a way that it engages into the longitudinal slot and cooperates with the projection of the potentiometer unit, namely such that the adjustment of the potentiometer unit is varied during a relative displacement between the outer tube unit and the inner tube unit.

Other embodiments of the invention form the objects of the dependent claims.

Embodiments and advantages of the invention are described in greater detail below with reference to the figures.

Figure 5A:
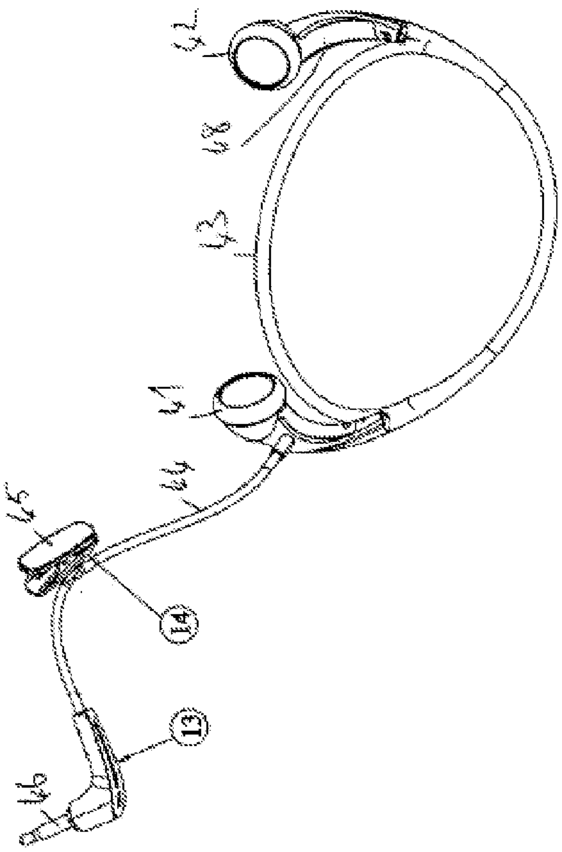
Figure 5B:
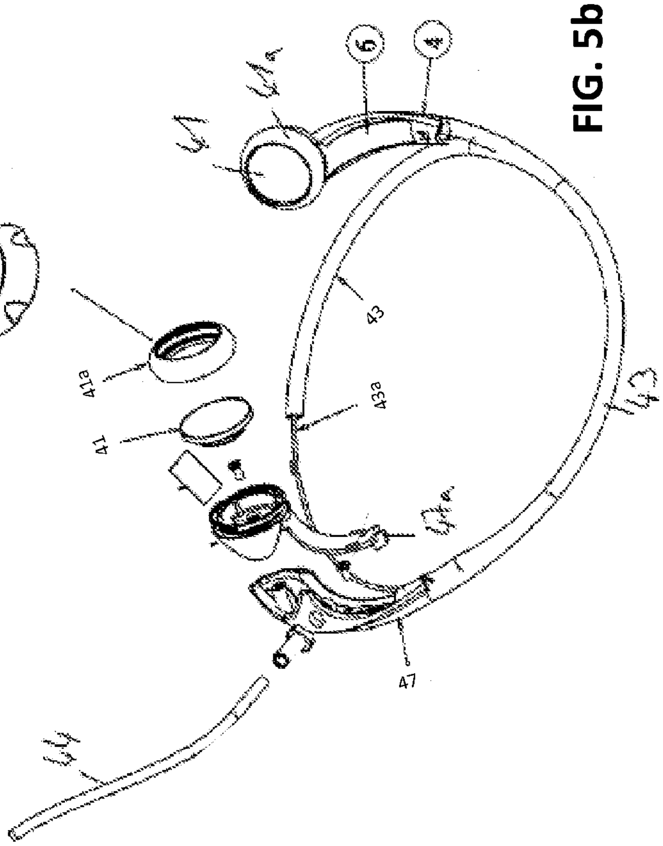
Figure 5C:
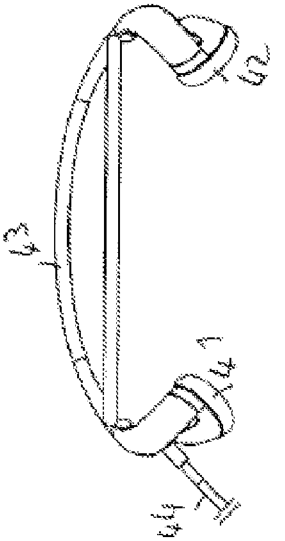
Figure 5D:
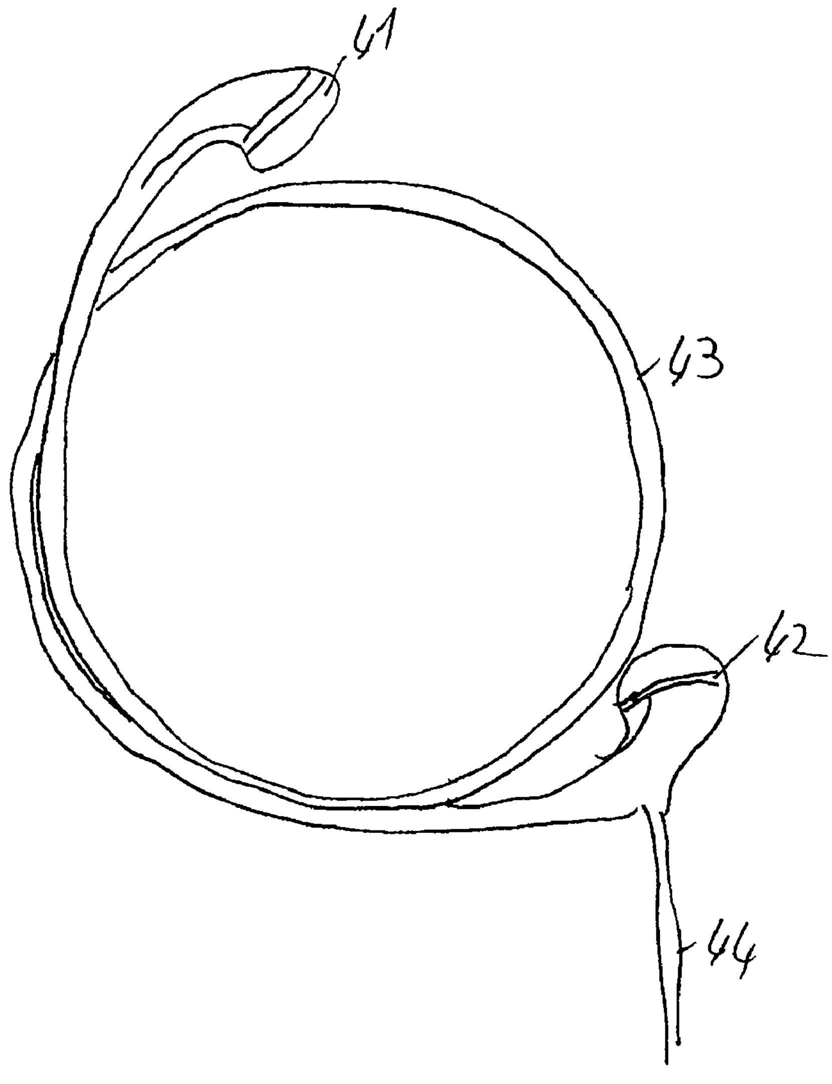
Figure 5E:
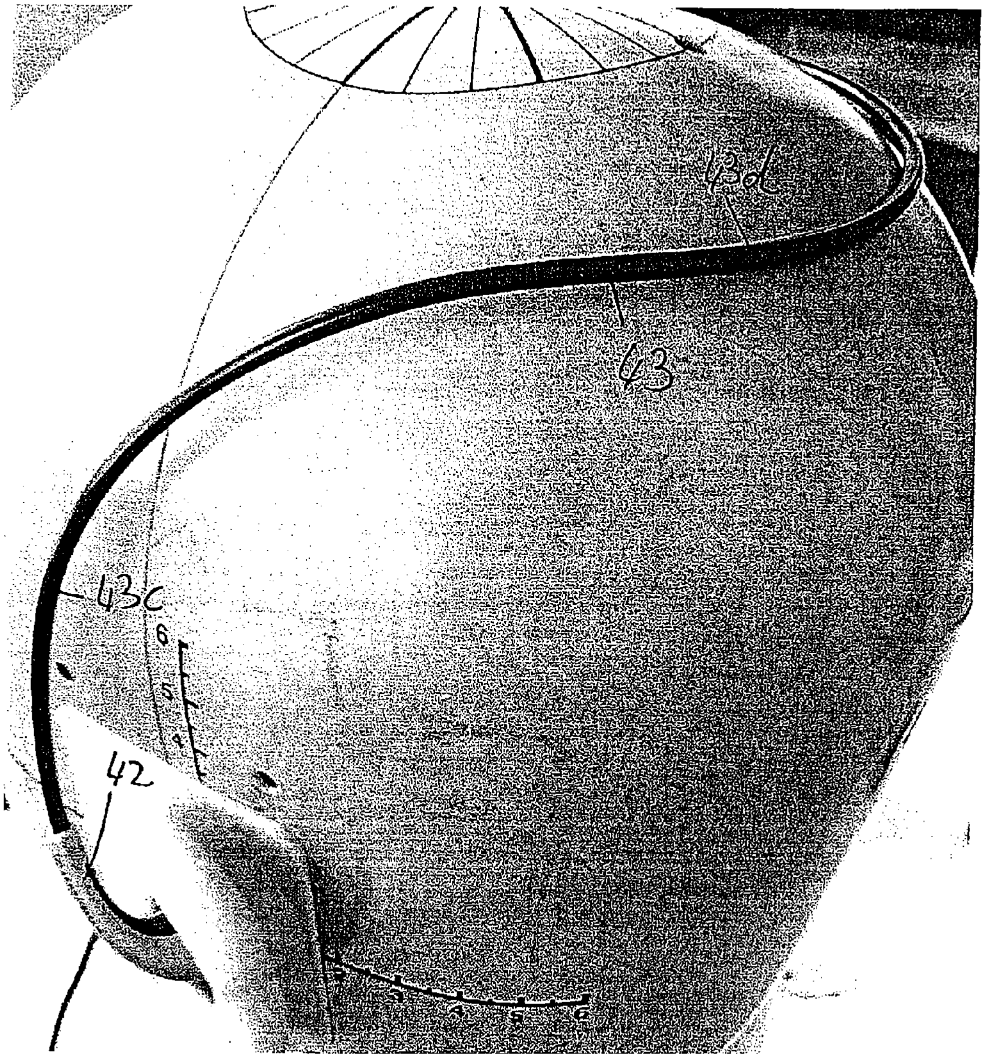
Figure 5F:
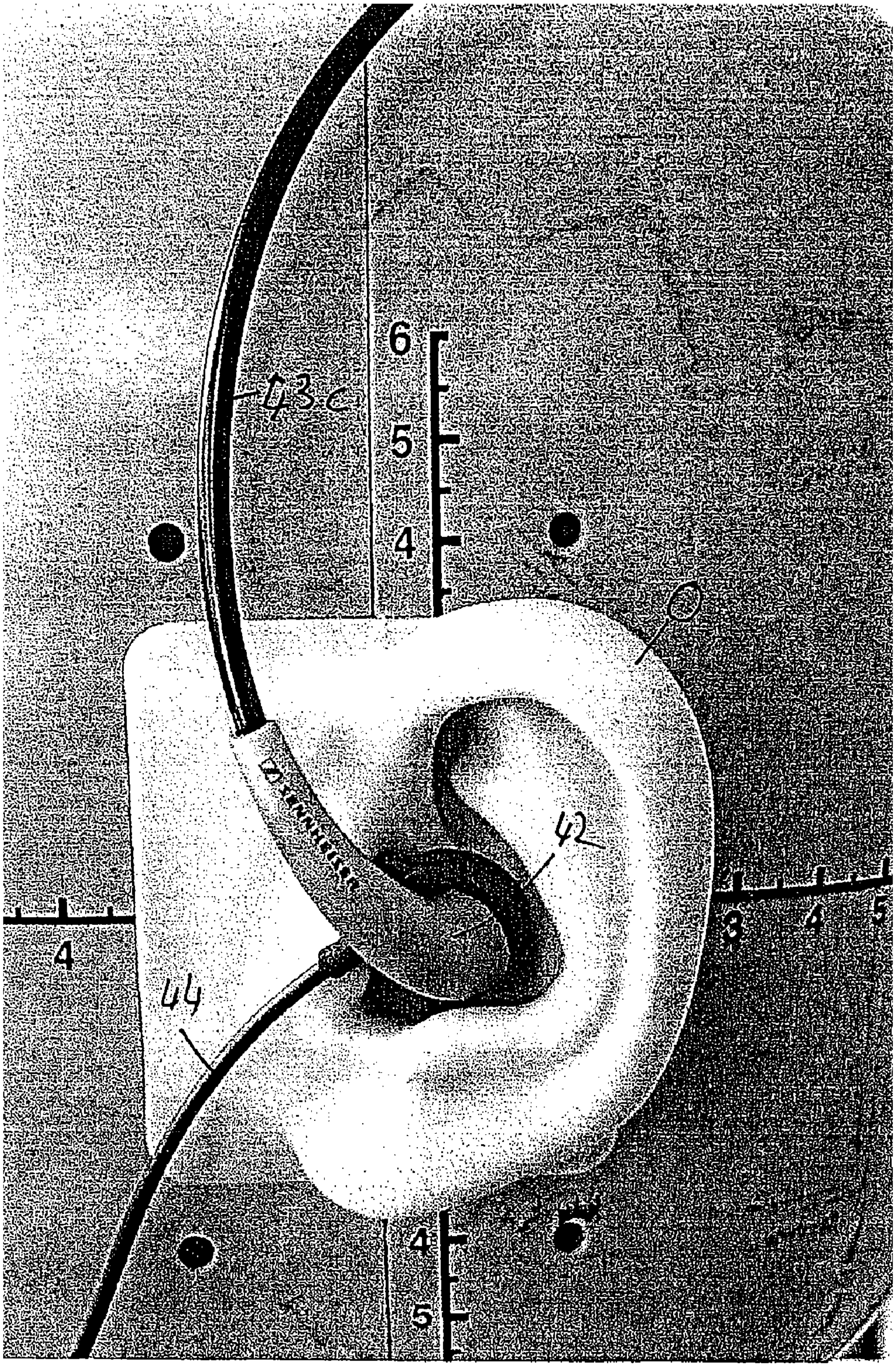
Figure 5G:
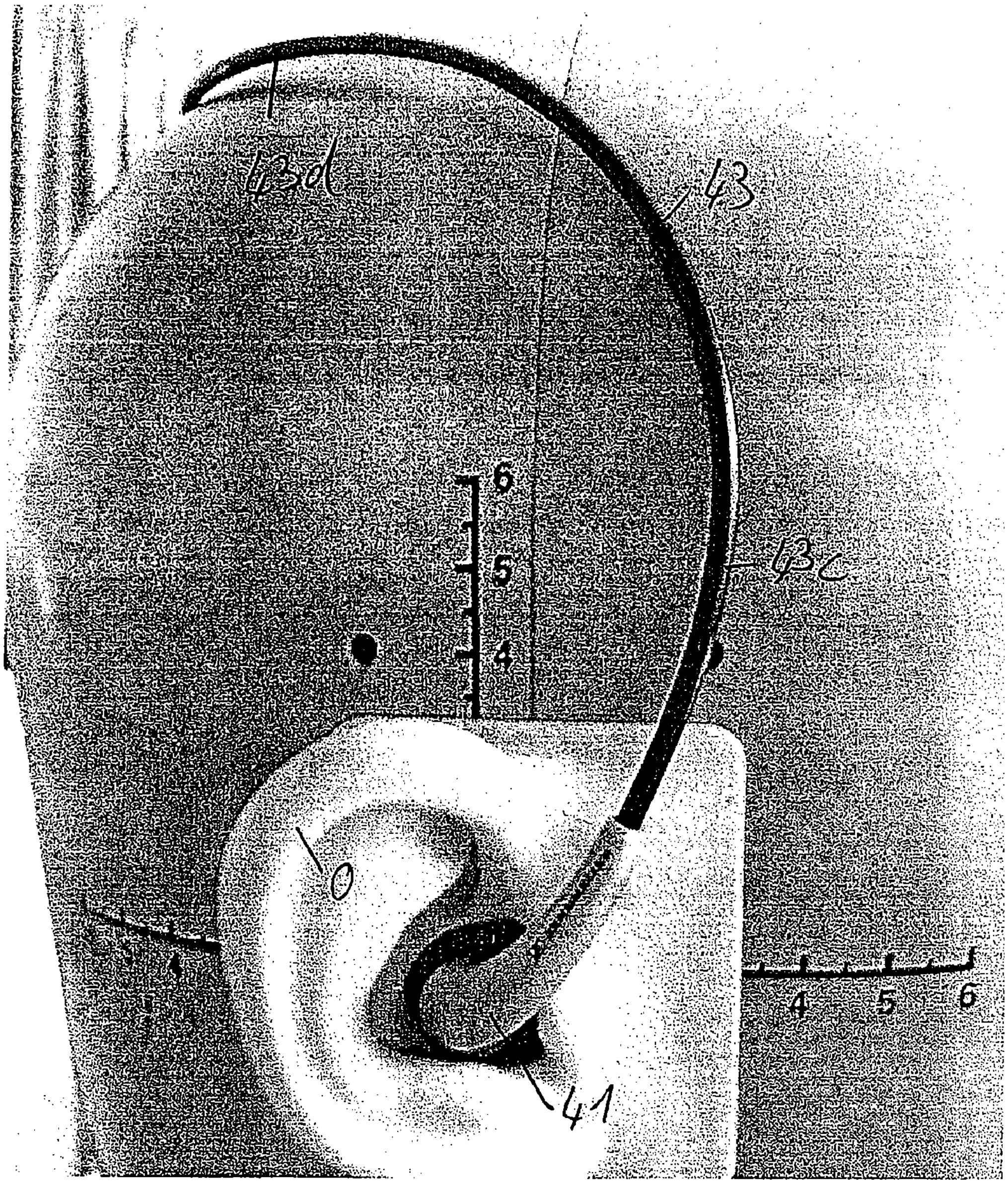
Figure 5J:
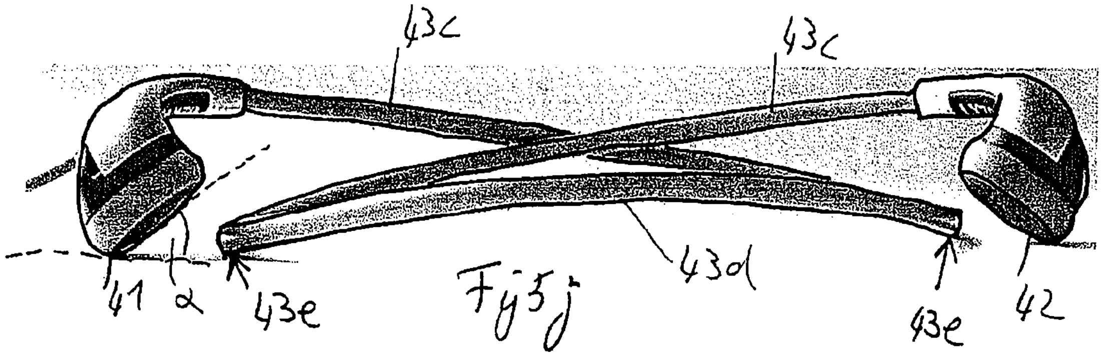
Figure 5K:
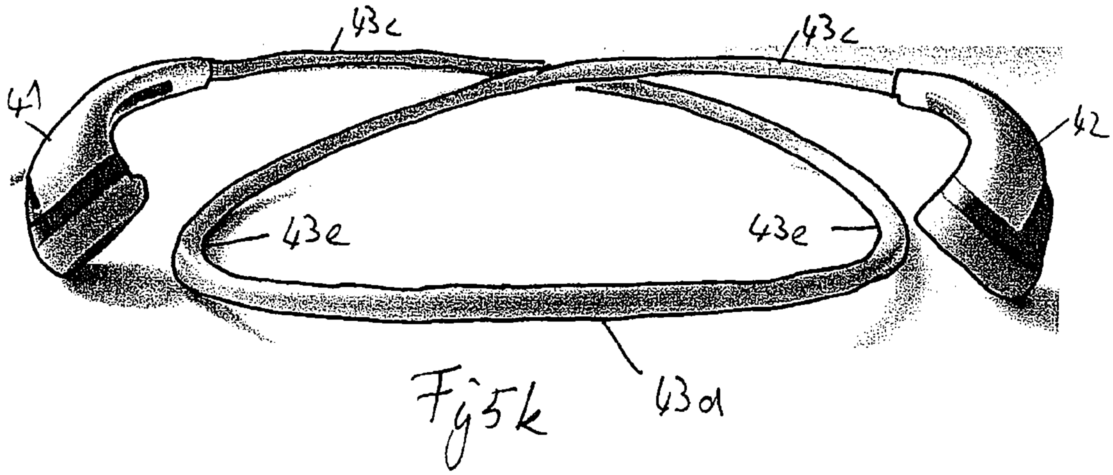
Figure 5E:
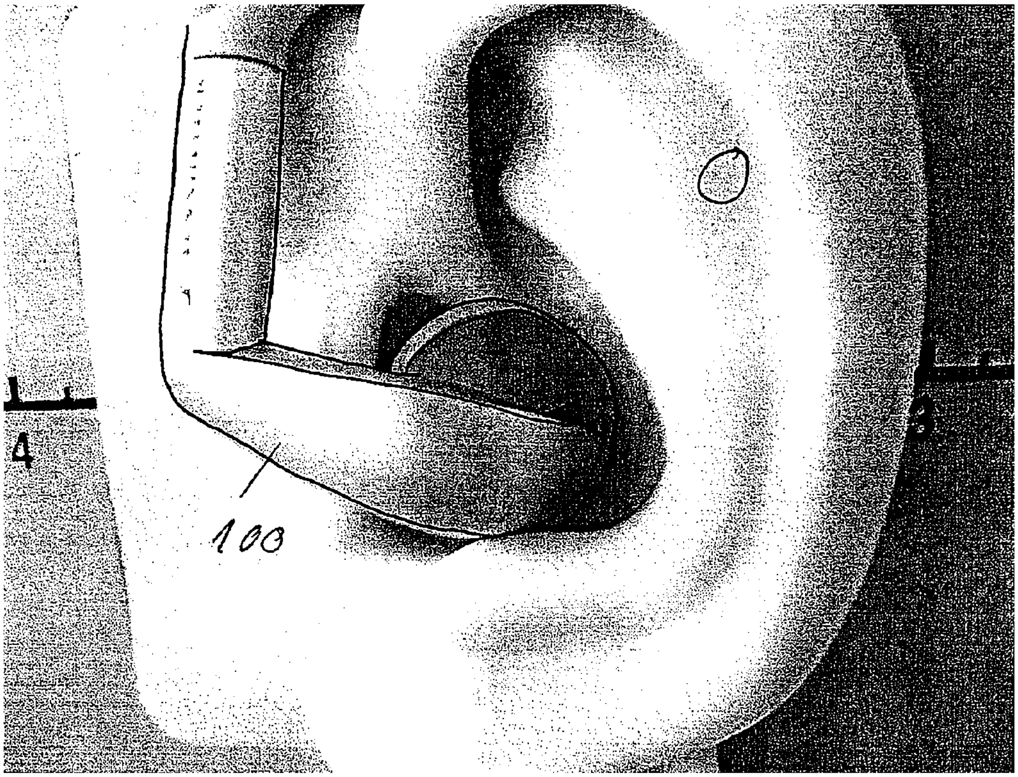
Figure 5M:
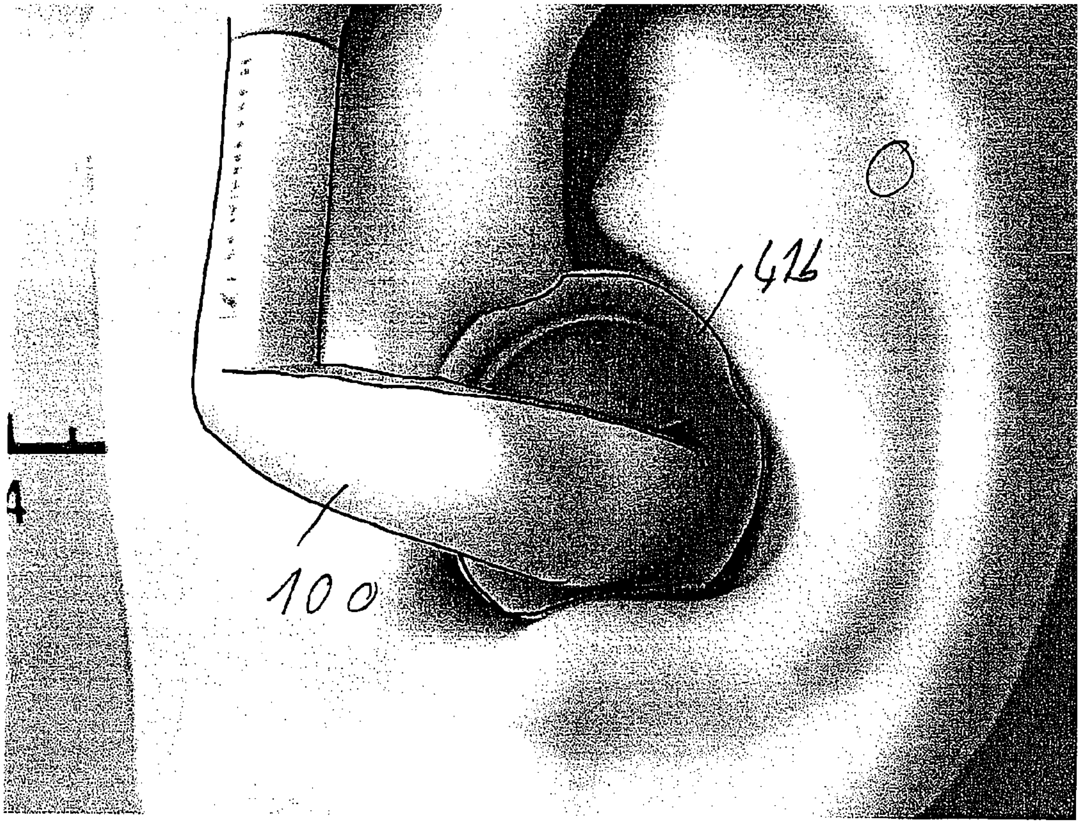
Figure 5N:
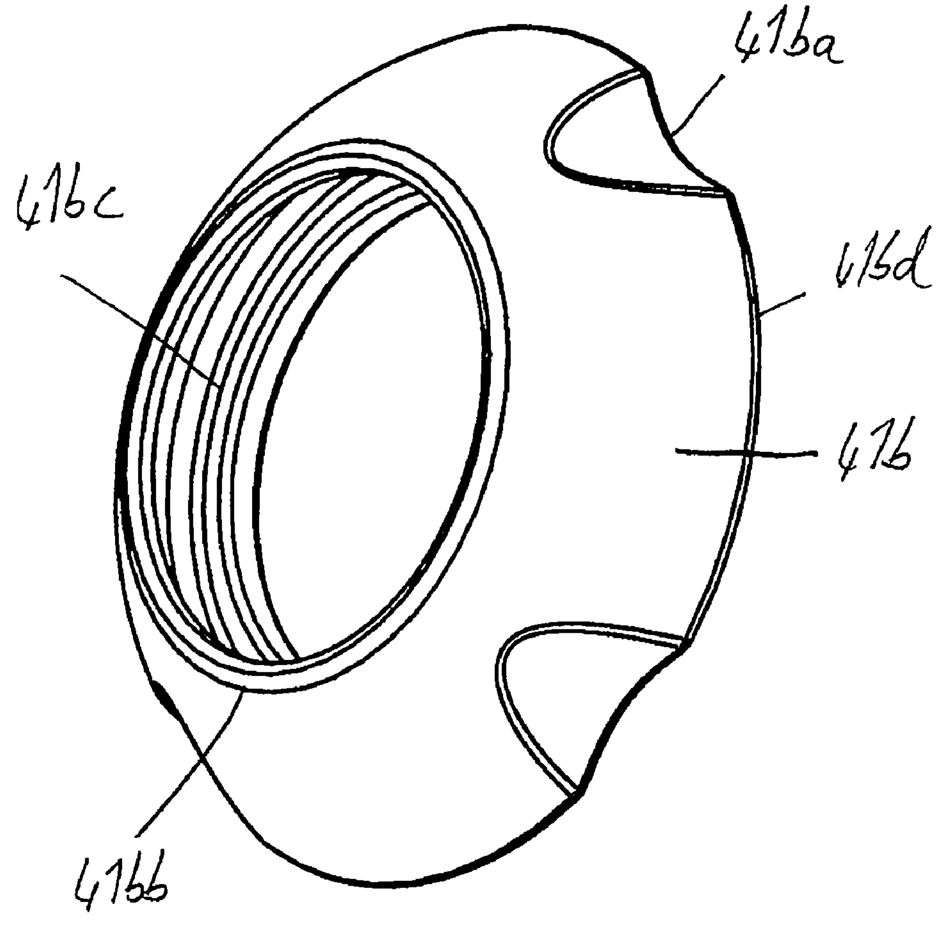

FIGS. 5 to 5*k* show images of a phone according to a fifth embodiment;

FIG. 5*l* to 5*n* show images of an ear adapter ring according to FIG. 5*b;*

Figure 6:
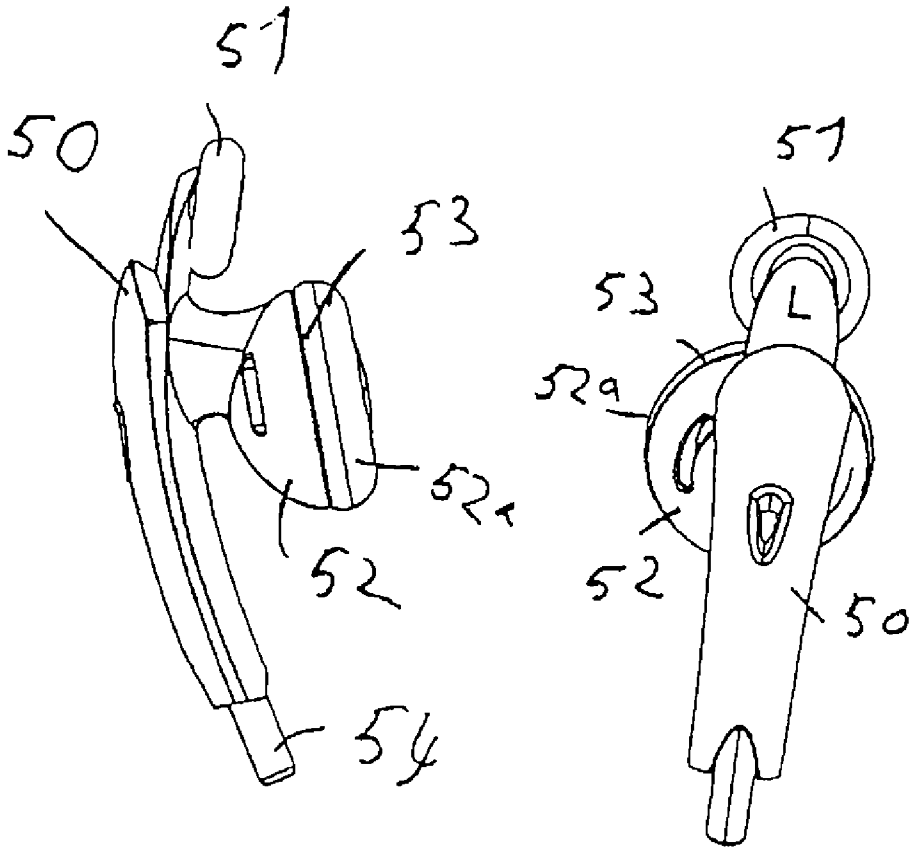
Figure 7A:
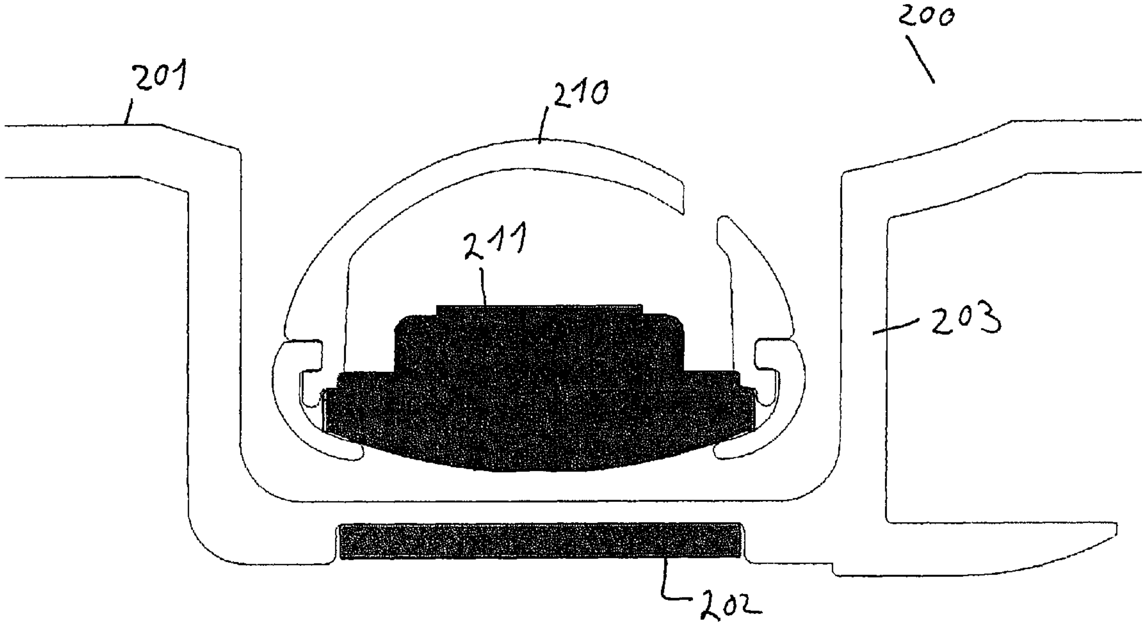
Figure 7B:
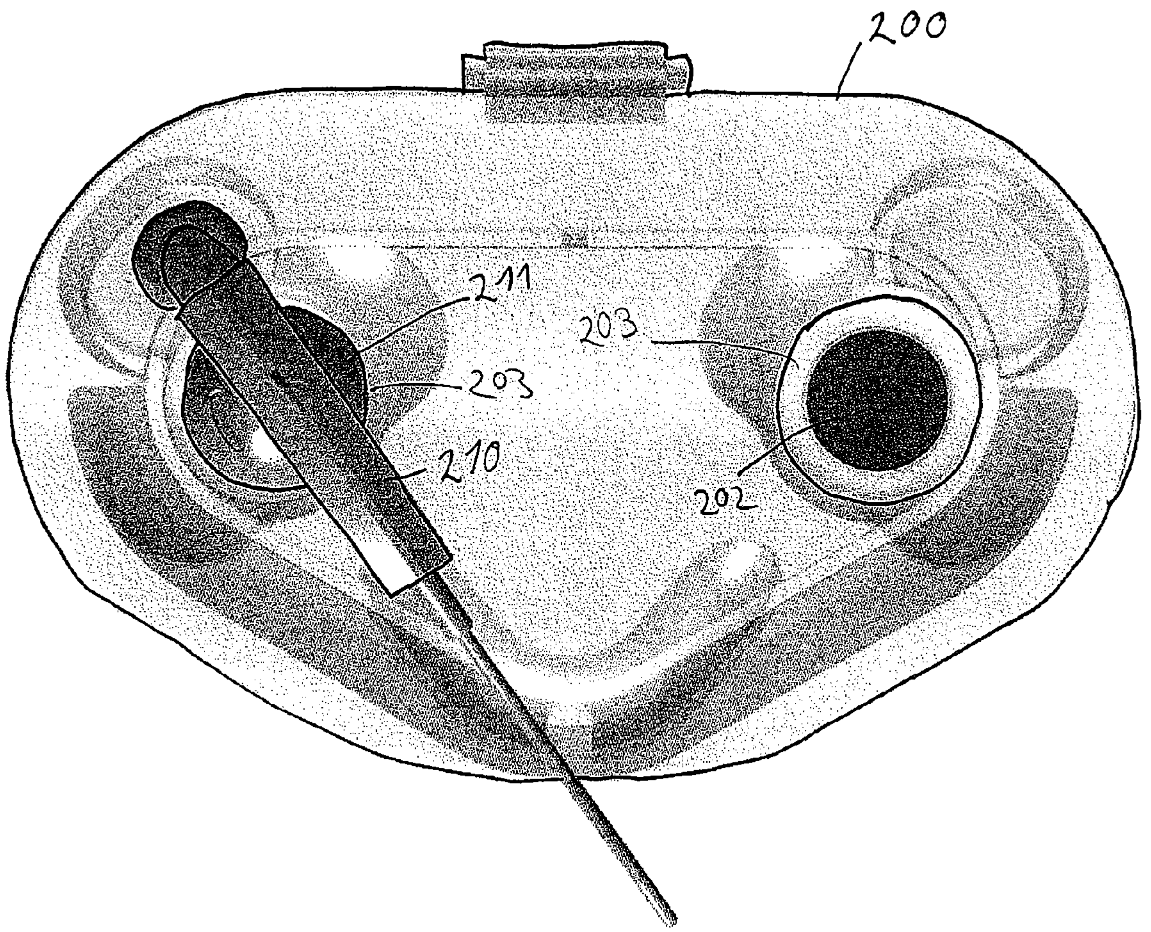
Figure 8A:
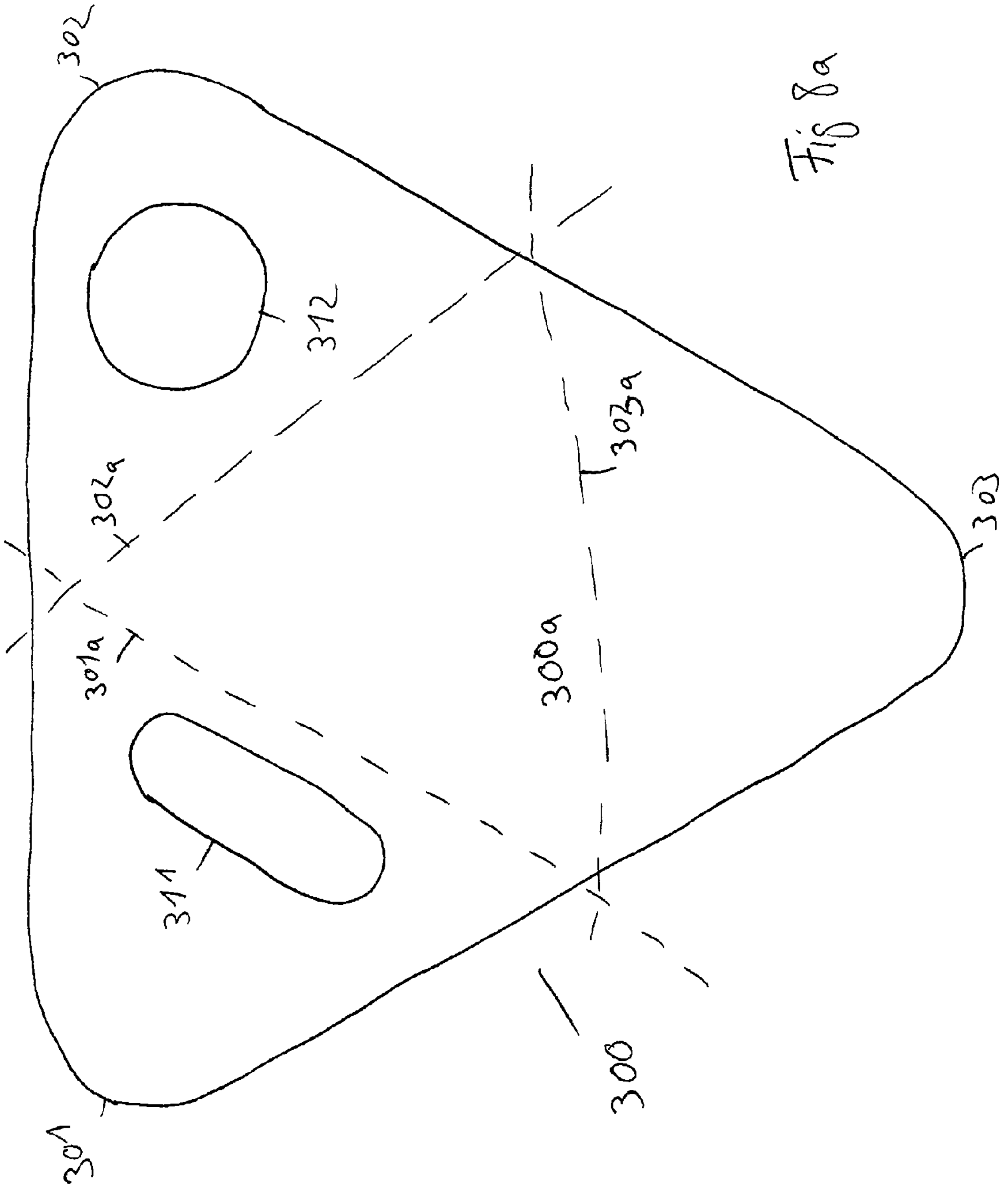
Figure 8B:
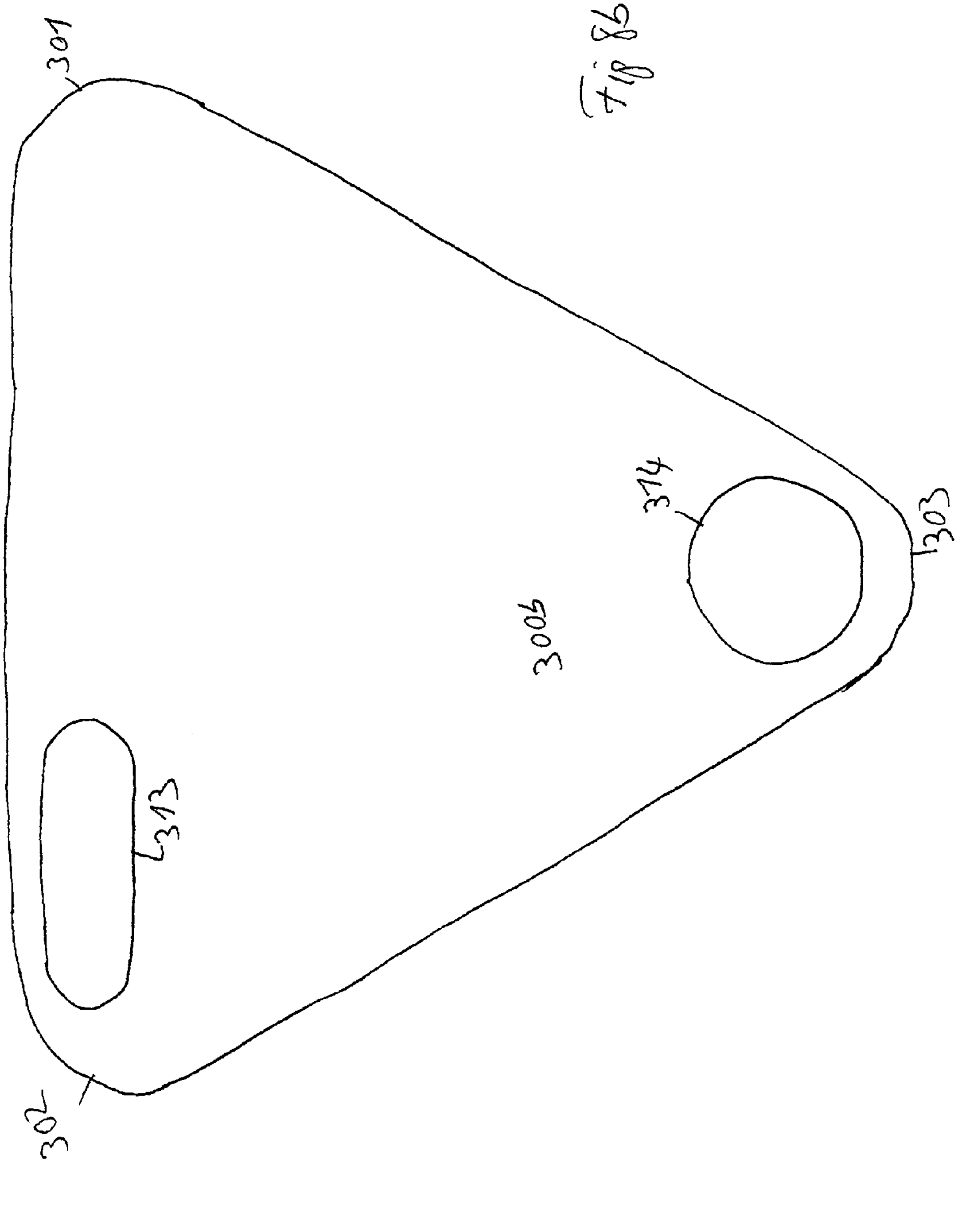
Figure 8C:
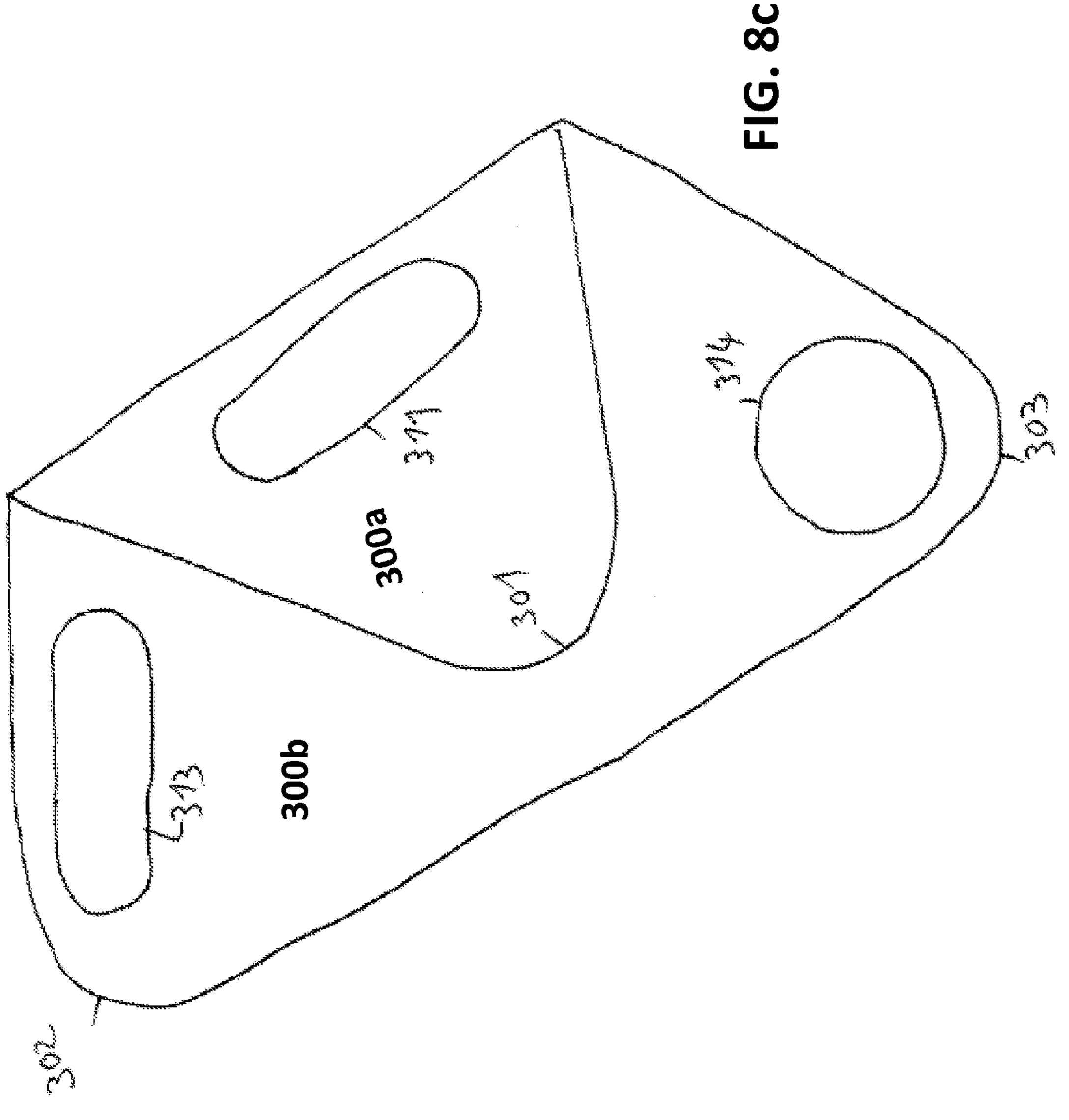

FIG. 6 shows several images of an in-ear phone according to a sixth embodiment;

FIG. 7*a* shows a schematic sectional representation of a section of a storage unit for phones;

FIG. 7*b* shows a top view of a storage unit for phones;

FIG. 8*a* shows a schematic representation of a storage pocket, in particular, for ear phones;

FIG. 8*b* shows a top view of a second side of a storage pocket;

FIG. 8*c* shows another image of the storage pocket according to FIG. 8*a;*

Figure 8D:
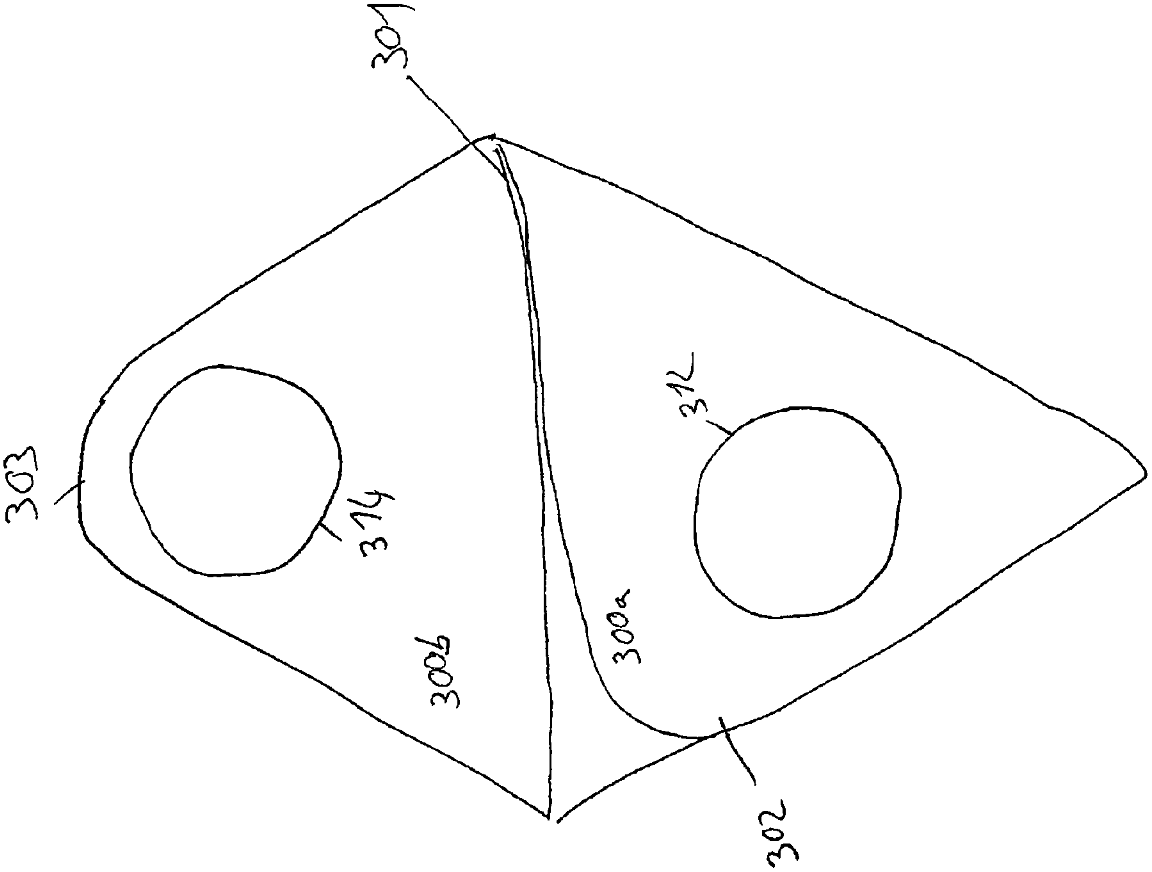

FIG. 8*d* shows another image of the storage pocket according to FIG. 8*a;*

Figure 8E:
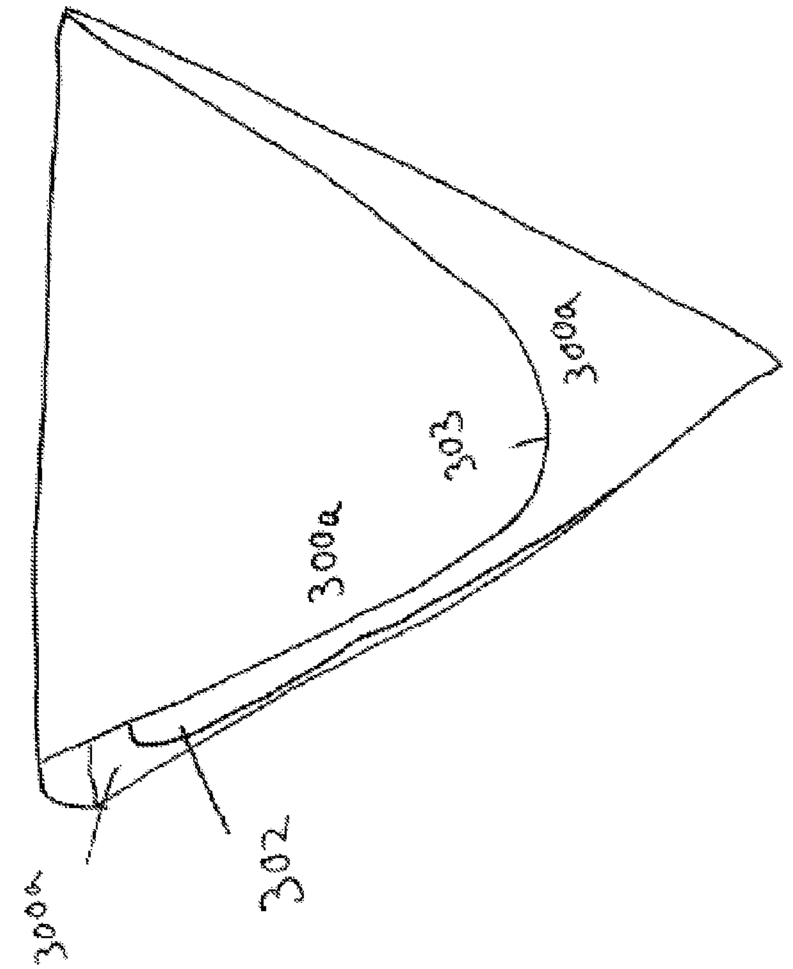

FIG. 8*e* shows another image of the storage pocket according to FIG. 8*a;*

Figure 9B:
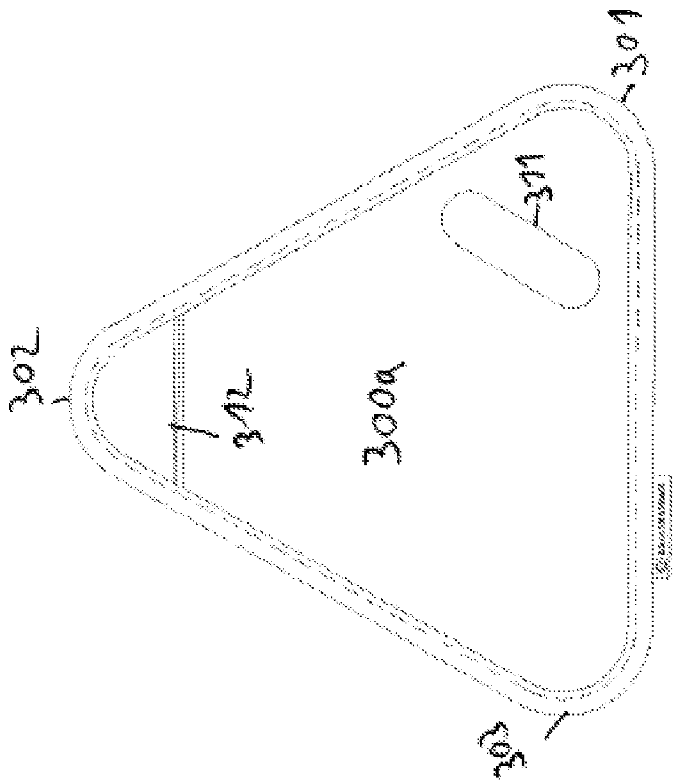
Figure 9A:
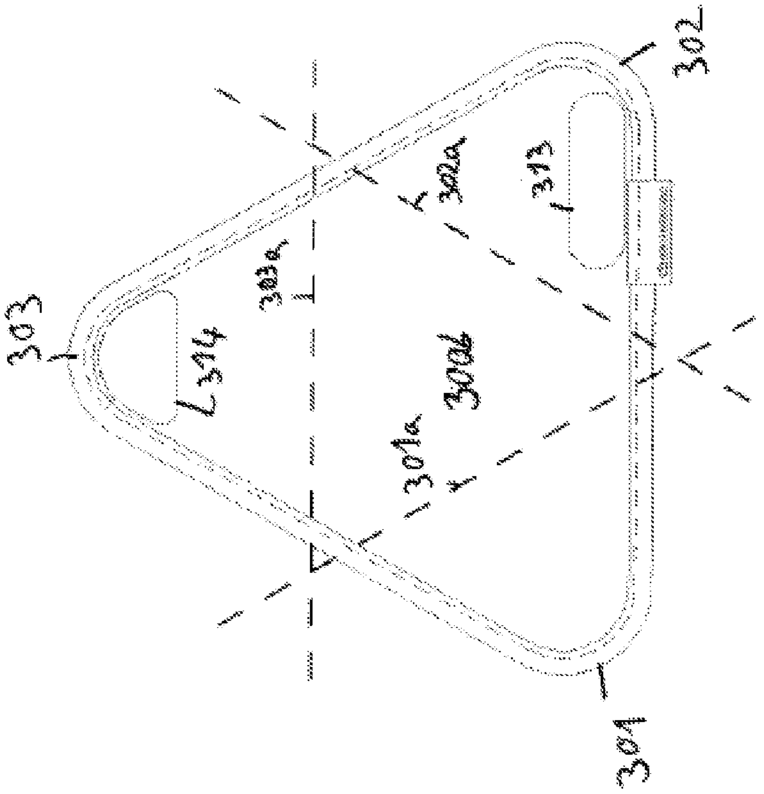
Figure 10:
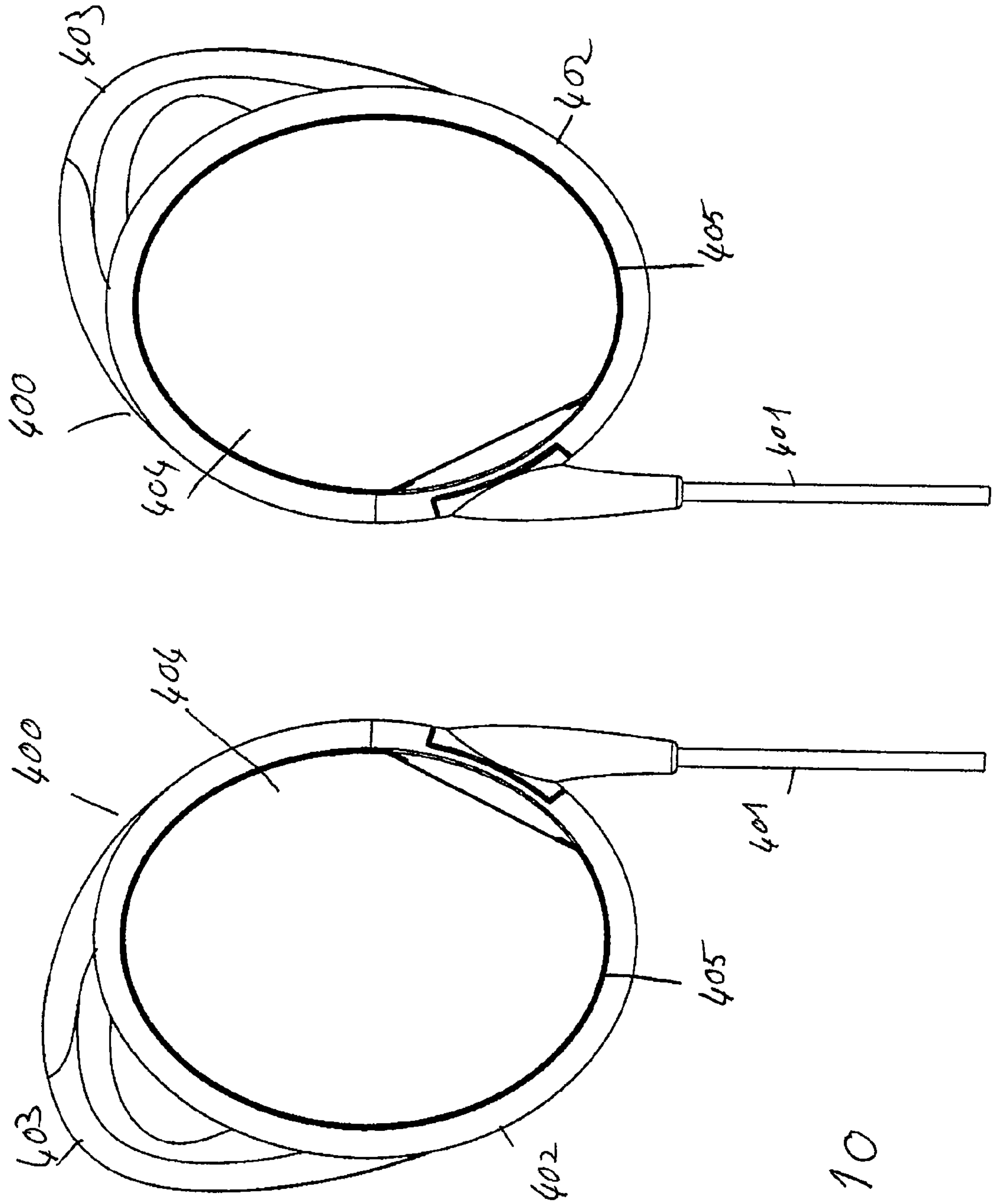

FIG. 9*a* shows an image of another storage pocket;

FIG. 9*b* shows another image of the storage pocket according to FIG. 9*a*, and FIG. 10 shows an image of a phone according to another embodiment.

Figure 1:
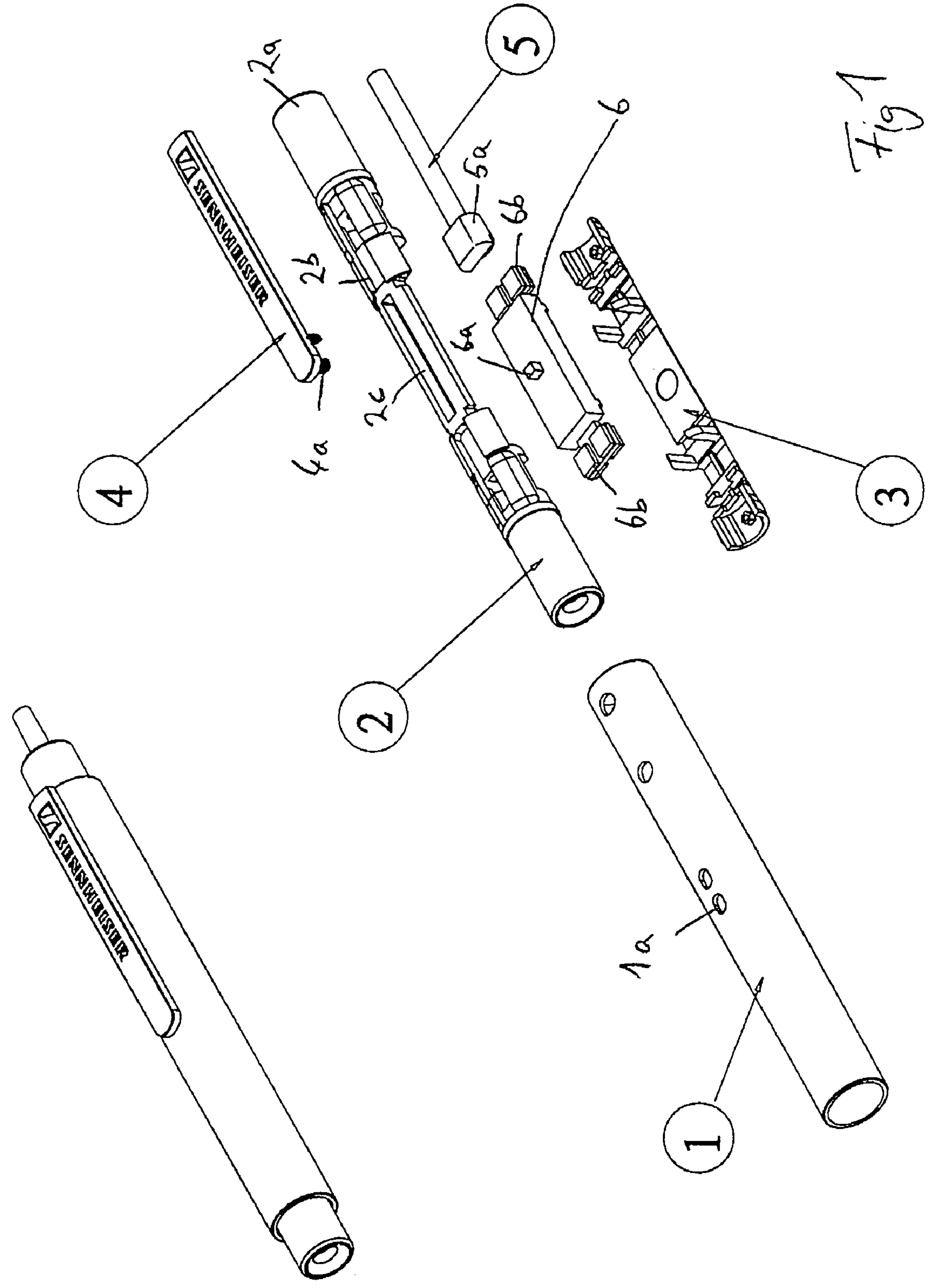
FIG. 1 shows a perspective representation of the components of a volume controller according to a first embodiment.

FIG. 1 shows a perspective representation of the components of a volume controller for a phone according to a first embodiment. The volume controller is preferably arranged in or on a feeder cable of the phone. The volume controller features an outer tube 1 with at least two openings 1*a*, as well as an inner tube 2 with a first and a second end 2*a* and an upper center piece 2*b*. The upper center piece 2*b* features a longitudinal slot 2*c*. A potentiometer unit 6 features a projection 6*a* on its upper side and connectors for a cable 5 on its first and its second end 6*b*. One end 5*a* of the cable 5 features a connector that can be connected to one of the ends 6*b* of the potentiometer 6. The projection 6*a* of the potentiometer is inserted into the longitudinal slot 2*a*, the ends 5*a* of the cable and of the potentiometer are connected to one another, and a lower center piece 3 is used for pressing the potentiometer unit against the upper center piece 2*b*. The projection 6*a* preferably engages into the longitudinal slot 2*c*. Subsequently, the outer tube 1 is pushed over the inner tube 2, and a counterpart 4 with two projections 4*a* is fixed on the outer tube 1 in such a way that the two projections 4*a* protrude through the openings 1*a* of the outer tube and through the longitudinal slot 2*c* and the projection 6*a* is held between the two projections 4*a*.

A relative movement between the outer tube and the inner tube causes the projections 4*a* and the projection 6*a* to be moved within the longitudinal slot 2c such that the potentiometer unit is adjusted accordingly and the volume of a phone is influenced.

Due to the design of the volume controller and, in particular, due to the fact that the outer tube 1 is pushed over the inner tube 2, the electrical and mechanical components of the potentiometer are reliably enclosed. In the volume controller according to FIG. 1, the actuator of the potentiometer is arranged within the outer tube 1. The actuator and the potentiometer preferably are respectively arranged between the upper center piece 2b and the lower center piece 3. This ensures an efficient protection of the mechanical and electrical components.

Although the slot 2c was described above in the form of a longitudinal slot, this slot may also be realized in the form of a transverse slot such that the projections 4a and 6a are guided in such a transverse slot by turning the outer tube in order to set or adjust the potentiometer accordingly. In such instances, the potentiometer unit 6 needs to be realized in the form of a rotary potentiometer unit rather than a sliding potentiometer.

Figure 2:
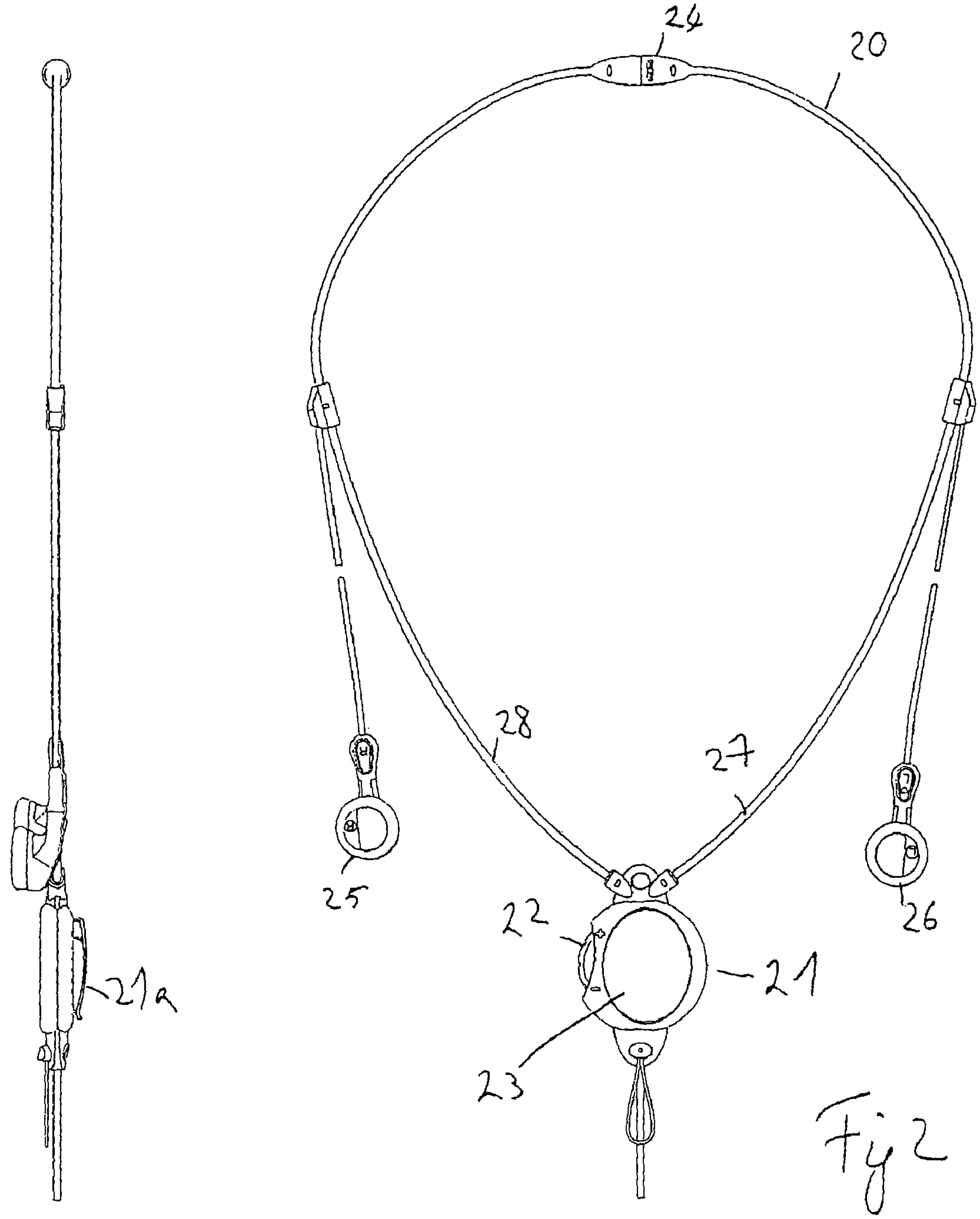
FIG. 2 shows an image of a phone with a volume controller according to a second embodiment.

FIG. 2 shows an image of an in-ear phone with a volume controller according to a second embodiment. This figure shows, in particular, a lanyard 20 that accommodates the left and the right transducer 26, 25. The lower area of the lanyard is provided with a volume controller 21, in which the volume can be adjusted accordingly by actuating a wheel 22. A ferriferous and/or nickeliferous plate or a magnet is preferably arranged on the front side 25 of the volume controller 21 in such a way that the rear sides of the transducer housings 26, 25 are held on the front side 23 due to magnetic attraction. To this end, the rear sides of the transducers 26, 25 either feature a ferriferous and/or nickeliferous plate or a magnet.

When the transducers are not needed, they can be held on the volume controller with their rear side by means of magnetic attraction. Alternatively, the transducers can also be fixed on one another back-to-back.

The rear side of the volume controller 21 may be provided with a clip 21a that makes it possible, for example, to fix the volume controller on the clothes of the user.

Figure 3:
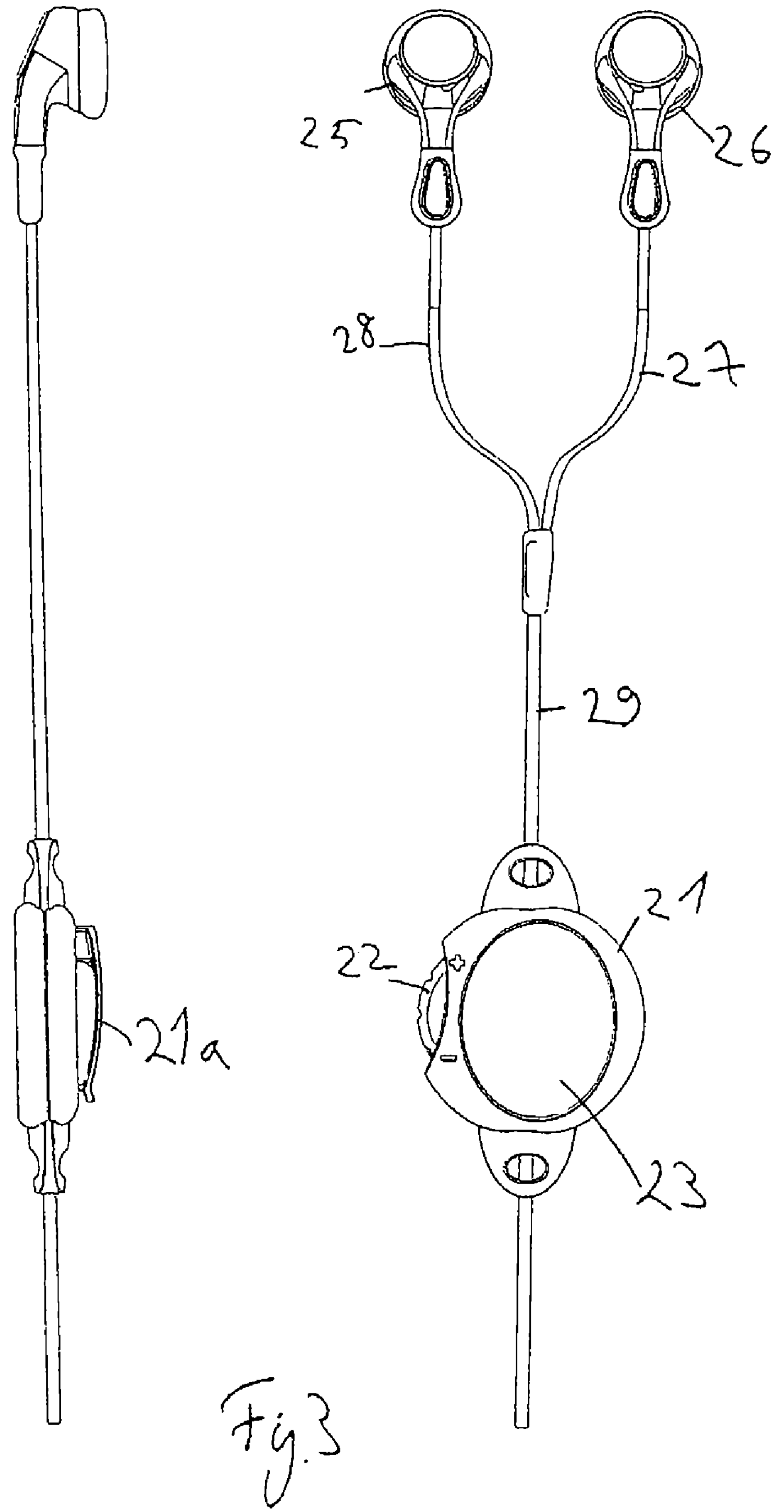
FIG. 3 shows an image of a phone with a volume controller according to a third embodiment.

FIG. 3 shows an image of an in-ear phone with a volume controller according to a third embodiment. The volume controller 21 according to the third embodiment corresponds to the volume controller according to the second embodiment. The transducers 26 and 25 according to the third embodiment correspond to the transducers 26, 25 according to the second embodiment. However, the second embodiment concerns a lanyard while the third embodiment concerns a conventional in-ear phone.

The rear side of the volume controller 21 may feature a clip 21a that makes it possible, for example, to fix the volume controller on the clothes of a wearer.

Figure 4:
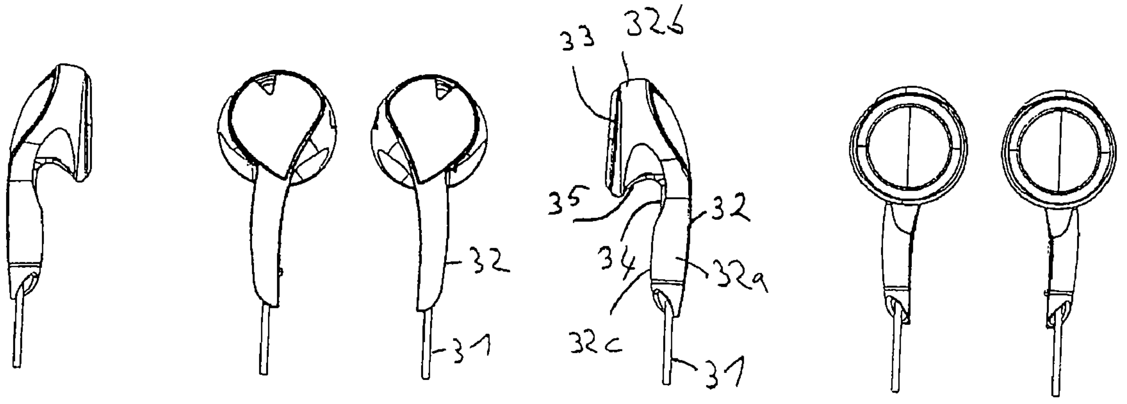
FIG. 4 shows an image of an in-ear phone according to a fourth embodiment.

FIG. 4 shows an image of an in-ear phone according to a fourth embodiment. The in-ear phone features a transducer housing 32, as well as a transducer 33, and is connected to a feeder cable 31. On its inner side, the housing 32 of the in-ear phone features a hook-shaped recess 34, 35 at the transition between a lower part of the housing 32a and the upper housing 32b. The inner side 32c of the housing is essentially realized straight in the lower region 32a, wherein the housing is then tapered (section 34) and ultimately widened (section 35) in order to accommodate the transducer 33.

A thusly designed in-ear phone makes it possible to respectively realize a reliable seat of the in-ear phone in or on the outer ear such that an in-ear phone of this type is also suitable for use during a physical activity. Due to the hook-shaped recess in the housing of the in-ear phone, the in-ear phone is able to better adapt to the ear and the sound of the in-ear phone can be better coupled into the inner ear.

The illustration of the in-ear phone according to the fourth embodiment in FIG. 4 essentially represents a 1-to-1 illustration of the phone and an exact image of the phone.

FIGS. 5a to 5c respectively show a perspective representation of a head phone according to a fifth embodiment. The head phone features a first and a second transducer 41, 42 that are connected to one another by an elastic (twisted) and prestressed strap (of essentially circular diameter) that is preferably realized in the form of a spring wire. The transducers 41, 42 are preferably realized in the form of in-ear phones. One of the transducers 41 is connected to an audio connector 46 by means of a cable 44. A clamp 45 may be provided along the cable 44 in order to fix the cable while the head phone is in use.

FIG. 5b shows another image of the head phone according to FIG. 5a. A flexible ring 41a or 41b that corresponds to the actual size of the outer ear—and can be exchanged by the user—can be placed over the transducer or the transducer housing 41. A cable 43a may be provided within the head band 43 in order to realize an electric feed from the cable 44 to the other phone.

FIG. 5c shows another image of the head phone according to FIG. 5a. The head band 43 or the head strap is respectively prestressed or preshaped in such a way that it is coiled up by 1 to about 1¾ turns in a relaxed state, i.e., up to about 630 degrees (coil angle), wherein the strap then has a diameter of about 80-100 mm, preferably 90 mm. In order to wear the head phone, the head strap needs to be bent apart such that a certain prestress is generated that presses the in-ear phones 41, 42 against the respective outer ear in order to ensure that it is reliably held thereon.

FIG. 5d shows a top view of the head phone according to the fifth embodiment. In this case, the head phone is shown in an unworn state such that the phone is coiled up into a loop due to the preshaping of the head band or the head strap 43. In this case, the loop has a coil angle between 360 and 720 degrees, preferably between 550 and 630 degrees. FIG. 5d shows a state, in which the head phone is automatically coiled up to a coil angle of about 560 degrees due to the shaping of the spring wire.

FIG. 5e shows the head phone according to the fifth embodiment in the worn state. In this case, the housing 42 of an in-ear phone penetrates into the outer ear of a wearer. The head band 43 extends upward in the direction of the vertex of the head from the housing 42. In this case, the head strap 43 is essentially divided into a first section 43c and a second section 43d. In the worn state, the housing 42 of the in-ear phone extends upward and the first section 43c of the head band is connected to the housing 42. The first section 43c is bent rearward (toward the back of the head). The second section 43d is also realized in a bent fashion and approximately extends on a circular path (section) referred to the center of the head. However, the first section 43c essentially extends parallel to the lateral section of the skull while the second section 43d extends on the upper side of the skull or at the transition between the upper side of the skull and the back of the head. The point at which the second section 43d actually contacts the head of a wearer depends on the size of the head. If the wearer has a large head, the second section 43d will be situated on the upper side of the skull. However, if the wearer has a small head, the second section 43d will be situated at the transition between the upper part of the skull and the back of the head, wherein the curvature of the section 43d is greater on a smaller head than on a larger head.

FIG. 5*f* shows a detailed image of a first section of the head phone according to the fifth embodiment. The housing 42 of the head phone is inserted into the outer ear O. The feeder cable 44 is fixed on the housing 42 in such a way that it hangs down from the outer ear O while the phone is worn.

FIG. 5*g* shows another image of the phone according to the fifth embodiment in a worn state. A housing 42 of the in-ear phone is arranged in the outer ear O. The first section 43*c* of the head band 43 initially extends essentially parallel to the lateral skull section and features a bend toward the rear part of the skull. The second section 43*d* also features a bend and lies on the transition between the back of the head and the upper side of the skull in this case. A prestress is exerted upon the phones due to this bend.

FIG. 5*h* shows a perspective side view of a phone according to a fifth embodiment. The first section 43*c* of the strap is essentially connected straight to the housing 240 of the in-ear phone. In FIG. 5*h*, the in-ear phone according to the fifth embodiment is illustrated in an unworn state, i.e., the strap 43 is coiled up accordingly.

FIG. 5*i* shows a schematic top view of the in-ear phone according to the fifth embodiment. In this case, the phone is also illustrated in an unworn state, i.e., the strap 43 is coiled up accordingly due to its prestress.

FIG. 5*j* shows another schematic image of the phone according to the fifth embodiment. In FIG. 5*j*, the phone is illustrated in an unworn state, i.e., in a coiled-up state, wherein the phone is placed on a smooth surface. This figure shows, in particular, that the housings 41, 52 of the in-ear phones are angled relative to the surface by an angle $\alpha$. This angle $\alpha$ lies between about 35° and 55°, preferably at about 40°. Bending points 43*e* are respectively provided in the region of the transition from the first section to the second section 43*c*, 43*e* of the strap 43.

FIG. 5*k* shows another perspective image of the phone according to the fifth embodiment. The phone is also illustrated in a coiled-up state in this case. A bending point 43*e* is also provided at the respective transitions between the first and the second section 43*c*, 43*d* of the strap.

The strap 43 is preferably made of spring steel and features two bending points at the transitions between the first section and the second section 43*c*, 43*d*. It is possible to either utilize the spring steel for transmitting the audio signals from one housing to the other housing or, alternatively, to provide another cable in the strap 43 for this purpose. The spring steel has a spring constant of about 800-1300 N/mm, preferably about 1100 N/mm. Due to the design of the phone, a contact pressure of less than 1 N is achieved.

Alternatively, it would also be possible to utilize a plastic for the implementation of the strap 43 instead of spring steel. In such instances, however, it is necessary to provide an additional line for transmitting the audio signals from one in-ear phone to the other in-ear phone.

The strap 43 of the phone according to the fifth embodiment is not only flexible, but also prestressed or preshaped in such a way that it has a diameter of about 80 to 100 mm, preferably 90 mm, in an unworn state. In order to wear the strap, the strap needs to be tensioned, namely by initially turning the phone by about 180° (referred to the longitudinal axis of the head strap) and then pulling the two phones outward. In the tensioned state, the phone has the shape illustrated in FIGS. 5*e*, 5*f* and 5*g*. Due to this rotation or torsion, the phones have the tendency to turn inward. The angle $\alpha$ (about 35-55°, preferably about 40°) according to FIG. 5*j* enables the phones to adapt to the outer ear accordingly when the head phones are worn. Due to this torsion, the phones are subjected to a force that causes the phones to adapt to the outer ear. The torsion is preferably adjusted in such a way that the front side of the transducers presses slightly outward in the worn state and the phone consequently turns in the direction of the ear canal. The phone therefore slightly turns against the protrusion of the outer ear such that the phone respectively locks in the outer ear or the ear canal and slightly turns toward the ear canal. This means that a torque of sorts is generated on the outer ear. The transducer housing therefore seals the outer ear in a superior fashion. In the transition area between the first and the second section 43*c*, 43*d* of the strap, angles 43*e* are preferably arranged in the spring steel. This angle is either pressed in or punched in. The two angles arranged in the transition areas not only cause the phone to be tightly fitted on the head, but the spring steel furthermore is only stabilized in the direction that corresponds to its design in the worn state. The selection of the angles 43*e* defines which side should represent the right side and which side should represent the left side.

The above-described torsion has a predominant direction such that the phone or the strap is only transformed into the intended shape for being worn by turning one phone in one direction. Consequently, a predominant unfolding direction is realized.

Although the head phone is illustrated with in-ear phones in FIGS. 5*a* to 5*k*, the head phone according to the fifth embodiment may also be realized with other phones.

FIG. 5*l* shows an image of an in-ear phone that is arranged in an outer ear O.

FIG. 5*m* shows another image of an in-ear phone in an outer ear. In FIG. 5*i*, the in-ear phone features an ear adapter ring 41*b*.

The ear adapter rings 41*a*, 41*b* shown in FIG. 5*b* are realized in a removable fashion such that an acoustic seal between a phone and the ear canal can also be ensured for different ear sizes with these sealing rings.

FIG. 5*n* shows a top view of an ear adapter ring according to FIG. 5*m*. This adapter ring respectively has a concavely curved cross section or is realized in a fungiform fashion, wherein a circular recess or hole 41*b* is provided in the center such that the ear adapter piece can be attached to a phone, particularly an in-ear phone. The outer region or the outer edge of the ear adapter piece 41*bd* may contain recesses 41*ba* that in part extend axially toward the inner edge. It should be noted, however, that these recesses do not extend completely up to the hole 44*bb*.

The ear adapter ring 41*b* is essentially realized in a fungiform fashion and, as described above, serves for sealing the phone in the outer ear. A bass attenuation may occur if a seal is produced between the phone and the ear canal. This applies, in particular, to phones with a rigid shape.

If a phone is at least partially inserted into and seals the ear canal, the membrane may be damaged due to the excess pressure in the auditory canal. This can be prevented with the utilization of the ear cushion ring 41*b*, wherein grooves or recesses are provided at least in part of the ring. Due to this measure, air compressed up to shortly before the complete insertion of the phone into an auditory canal can be respectively discharged or escape.

FIG. 6 shows an image of an in-ear phone according to a sixth embodiment. The housing 50 of the in-ear phone features a transducer housing 52 for a transducer 53 and is connected to a cable 54. In addition, the in-ear phone features a support element 51 that is essentially aligned with the cable 54. Such a transducer is inserted above the auditory canal and the support element 51 is anchored in the concha. The phone therefore can be securely fixed by means of this two-point anchoring. The support elements 51 and the attachable ring

52*a* may have different sizes such that the in-ear phone can be adapted to different configurations of an outer ear and the concha.

FIG. 7*a* shows a schematic sectional representation of a section of a storage unit for phones. The storage unit 200 features a recess 203 that is designed in such a way that a phone 211 can be placed therein. A metal plate 202 is arranged on the underside of the recess from outside. The phone 210 shown features an electroacoustic transducer 211 with a magnet. When the phone is placed into the recess 203, the magnet in the electroacoustic transducer 211 and the metallic magnetizable plate 202 cooperate in such a way that the phone 211 is magnetically attracted and therefore held in the recess 203.

FIG. 7*b* shows a top view of a storage unit for phones. The storage unit 200 features a recess 203 for each phone 210. A magnetizable disk that preferably consists of iron or nickel or a combination thereof is arranged in this recess 203. The phone 210 is placed into the recess 203 with its electroacoustic transducer pointing downward such that it is held therein due to the magnetic forces between the transducer 211 and the disk 202.

As an alternative to the metal disk 202, it would also be possible to arrange a magnet or a magnet unit in the recess 203 in order to thusly realize the magnetic attraction relative to the electroacoustic transducer 211. In this case, it needs to be observed that this magnetic unit is correspondingly polarized such that the phone 210 is attracted and not repelled.

FIG. 8*a* shows a schematic image of a storage pocket, particularly for ear phones. The storage pocket essentially has a triangular design with a first, a second and a third corner 301, 302 and 303. A first Velcro section 311 is sewn on the first side 300*a* of the pocket in the region of the first corner 301, and a second Velcro section 312 is sewn on in the region of the second corner 302. The pocket has three folding lines 301*a*, 302*a* and 303*a*.

FIG. 8*b* shows a top view of a second side of the storage pocket. The second side 300*b* of the storage pocket features a third Velcro section 313 that is sewn on in the region of the second corner 302 and a fourth Velcro section 314 that is sewn on in the region of the third corner 303.

FIG. 8*c* shows another image of the storage pocket according to FIG. 8*a*. In this case, the first corner 301*a* was folded in along the folding line 302*a* such that the first sewn-on Velcro section 311 is visible.

FIG. 8*d* shows another image of the storage pocket according to FIG. 8*a*, wherein the second corner 302 is now folded along the second folding line 302*a* in such a way that the sewn-on Velcro sections 301 and 303 cooperate and connect the first and the second end 301, 302 to one another.

FIG. 8*e* shows another image of the storage pocket according to FIG. 8*a*. In this image, the third corner was folded along the third folding line 303*a* in such a way that the sewn-on Velcro sections 312 and 314 are connected to one another and the storage pocket is closed. FIG. 8*d* shows the storage pocket in an opened state.

FIG. 9*a* shows an image of another storage pocket and FIG. 9*b* shows another image of the storage pocket according to FIG. 9*a*. In the unfolded state, the storage pocket is essentially triangular and has three corners 301, 302 and 303. One side 300*b* of the pocket features two sewn-on Velcro sections 313 and 314, wherein the Velcro section 313 is arranged in the region of the second corner 303 and the Velcro section 314 is arranged in the region of the third corner 303. FIG. 9*b* shows the other side of the storage pocket according to FIG. 9*a*. On this side 300*a*, the pocket features a Velcro section 311 that is sewn on in the region of the first corner 301 and a Velcro section 302 that is sewn on in the region of the second corner 302.

In order to fold up the pocket, the first corner 301 is initially folded in along the folding line 301*a*. Subsequently, the second corner 302 is also folded in along the folding line 302*a* such that the sewn-on Velcro sections 311 and 313 can be attached to one another. The third corner 303 is ultimately folded along the folding line 303*a* such that the pocket can be closed and essentially represents a triangle in the closed state.

Although sewn-on Velcro sections were used in the description of FIGS. 8*a* to 9*b*, the foldable storage pocket according to FIGS. 8*a* to 9*b* can also be realized with fastening elements other than sewn-on Velcro sections, for example, snap-fasteners or buttons that can be connected to one another by means of magnetic attraction.

The sewn-on Velcro section 313 or the connecting unit 313 is essentially arranged in the region of the second corner 303 along the edge between the first corner 301 and the second corner 302. The sewn-on Velcro section 314 or the fastening unit 314 is arranged in the third corner 303. The sewn-on Velcro section 311 or the fastening unit 311 is arranged in the region of the first corner 301 and essentially aligned toward the edge between the second and the third corner 302, 303. Due to these measures, the sewn-on Velcro sections cannot damage the material of the folding pocket if it is folded up incorrectly.

FIG. 10 shows an image of a phone according to another embodiment. This phone is realized, in particular, in the form of an ear phone. The phone features a line 401 and a phone housing 402. An ear hook 403 is fixed on the phone housing 402 and hooked behind the ear of the wearer while the phone is worn.

The outer side of the phone housing 402 contains a recess 405 that serves for attaching or fixing an exchangeable cover unit 404 thereon. When the snap-on unit 404 is fixed on the recess 405, the acoustic properties of the phone are altered. Consequently, it is possible to purposefully influence the acoustic properties of the phone with differently designed snap-on units 404.

Until now, the acoustic properties of a phone were defined during the development phase by the geometry of the phone, as well as by the materials used, and could not be readily changed thereafter. In order to adjust an acoustic short circuit, for example, damping materials such as silks, damping papers, foams and the like are used. The selection of the materials makes it possible to influence these properties accordingly. However, it would be desirable to enable the users to adjust the acoustic properties of the phones themselves and therefore to realize an individual adjustment thereof.

In the phone illustrated in FIG. 10, this may be realized, for example, by using different snap-on units or covers 404, wherein the snap-on units or covers alter the acoustic properties of the phone. For example, an acoustically effective volume can be produced or altered with the design of the snap-on unit 404. These snap-on units make it possible, for example, to influence the rear volume of the transducer system in the phone 400 such that the acoustic properties of the phone are also altered. In the embodiment shown in FIG. 10, the exchangeable acoustic elements are realized in the form of snap-on units 404 and therefore visible from outside.

Alternatively, the exchangeable acoustic elements may also be designed such that they are concealed and not visible from outside. Acoustic elements of this type may be realized, for example, in the form of cartridge-like damping elements that can be screwed in and screwed on. These damping elements or acoustic elements may contain, for example, sponges or can alter or contain defined acoustically effective volumes.

Consequently, it is possible to provide different acoustic elements or damping elements that adapt the acoustic properties of a phone to the individual taste of a user. The acoustic elements or the damping elements may furthermore be adapted to different styles of music such that the phone can be adjusted to a certain style of music by exchanging the damping elements or the acoustic elements, respectively. Consequently, the effect that was achieved until now with the aid of an electronic equalizer, for example, in a reproduction device can be realized directly on a phone.

This means that exchangeable damping elements are provided that also have an acoustic function. Such damping elements can be used on head phones, as well as on ear phones, in order to influence the acoustic properties of the phones. The exchangeable damping elements or acoustic elements are preferably realized in such a way that the end users themselves are able to exchange these elements. The damping elements consequently are preferably realized in a snap-in, snap-on or screwable fashion.

A housing of the phone may contain, for example, a recess for inserting or screwing a cartridge-like damping element or acoustic element therein in order to thusly alter the acoustic properties of the phone.

The exchangeable damping elements make it possible, for example, to influence the frequency response, the bass response, the treble response and the midrange response.

If the exchangeable damping elements or acoustic elements are realized in the form of covers for a phone, it is possible, for example, to convert the phone from a closed phone to an open phone by exchanging the cover such that the tuning behavior of the phone is altered. The conversion of a closed phone into an open phone, for example, by exchanging the exchangeable damping elements may provide the advantage that the environment can be better perceived. This may be particularly advantageous while riding a bicycle. However, if it is preferred to perceive less ambient noise, an open phone can be converted into a closed phone, for example, by exchanging the damping elements.

If the exchangeable damping elements are realized, for example, in the form of covers for a phone, the volume can be influenced behind the ventilation opening by means of the differently designed covers such that the acoustic properties of the phone are altered due to the volume of the ventilation opening. In order to manipulate the reproduction of the phone, the above-described covers may, for example, provide a different volume between the cover and the phone. Alternatively or additionally, the cover may also contain a hole or an opening that also causes an alteration of the acoustic properties of the phone. Although FIG. 4 clearly shows an ear phone with a hook, the exchangeable acoustic elements can also be implemented on other phones such as, for example, a head phone, an ear phone or an in-ear phone.

The invention claimed is:

1. A volume control unit for a phone, comprising:

a first hollow body;

a second body that can be accommodated by the first hollow body, the second body having a first end and a second end with a slot arranged therebetween; and a potentiometer unit having a first coupling means on its upper side, the potentiometer unit disposed within the second body, the first hollow body having a second coupling means configured to engage the first coupling means through the slot in the second body, wherein the potentiometer unit is arranged in the second body in such a way that the first coupling means and the second coupling means provide adjustment of the potentiometer unit by a relative movement between the first hollow body and the second body.

2. The volume control unit according to claim 1, wherein the first hollow body is arranged as an outer tube unit and the second body is arranged as an inner tube unit.

3. The volume control unit according to claim 1, further comprising:

at least one opening in the first hollow body, a first projection on the upper side of the potentiometer unit, the first projection being part of the first coupling means;

a counterpart coupled to the first hollow body, the counterpart having at least one second projection configured to extend into the at least one opening of the first hollow body, the second projection being part of the second coupling means, wherein the first hollow body extends over at least a portion of the second body and the at least one second projection of the counterpart extends into the at least one opening of the first hollow body in such a way that it engages into the slot and cooperates with the first projection of the potentiometer unit to provide adjustment of the potentiometer unit by a relative displacement between the first hollow body and the second body.

4. A head phone with a volume control unit according to claim 1.

* * * * *

UNITED STATES PATENT AND TRADEMARK OFFICE

CERTIFICATE OF CORRECTION

PATENT NO. : 8,325,942 B2
APPLICATION NO. : 12/294219
DATED : December 4, 2012
INVENTOR(S) : Kuhr et al.

It is certified that error appears in the above-identified patent and that said Letters Patent is hereby corrected as shown below:

In the Specification:

In column 1, line 7, please delete “which is” and insert --which are--.

In column 2, line 44, please add a --,-- after “phone”.

In column 3, line 23, please add a --,-- after “controller”.

In column 3, line 29, please replace “front side 25” with --front side 23--.

In column 3, line 42, please add a --,-- after “controller”.

In column 3, line 43, please add a --,-- before and after “according to the third embodiment”.

In column 3, line 45, please add a --,-- before and after “according to the third embodiment”.

In column 3, line 53, please add a --,-- after “in-ear phone”.

In column 4, line 3, please add a --,-- before and after “according to the fourth embodiment in FIG. 4”.

In column 4, line 7, please add a --,-- after “head phone”.

In column 4, line 18, please add a --,-- after “head phone”.

In column 4, line 35, please add a --,-- after “head phone”.

In column 4, line 44, please add a --,-- after “head phone”.

In column 5, line 2, please add a --,-- after “phone”.

Signed and Sealed this
Eleventh Day of June, 2013

Teresa Stanek Rea
*Acting Director of the United States Patent and Trademark Office*

In column 5, line 6, please add a --,-- after "phone".

In column 5, line 15, please add a --,-- after "phone".

In column 5, line 17, please delete "housing 240" and insert --housing 42--.

In column 5, line 18, please add a --,-- after "phone".

In column 5, line 19, please add a --,-- after "embodiment".

In column 5, line 22, please add a --,-- before "according".

In column 5, line 25, please add a --,-- before "according".

In column 5, line 29, please delete "housings 41, 52" and insert --housings 41, 42--.

In column 5, line 36, please add a --,-- before "according".

In column 5, lines 54-55, please add a --,-- before and after "according to the fifth embodiment".

In column 5, line 59, please replace "referred" with --referring--.

In column 5, line 64, please add a --,-- before and after "according to FIG. 5j".

In column 6, lines 25-26, please add a --,-- before and after "according to the fifth embodiment".

In column 6, line 27, please replace "phone" with --phone 100--.

In column 6, line 30, please replace "FIG. 5i" with --FIG. 5m--.

In column 6, line 36, please add a --,-- after "adapter ring".

In column 6, line 45, please delete "hole 44bb" and insert --hole 41bb--.

In column 5, line 59, please add a --,-- after "in-ear phone".

In column 7, line 30, please replace "storage pocket" with --storage pocket 300--.

In column 7, line 43, please add a --,-- after "storage pocket".

In column 7, line 47, please add a --,-- after "storage pocket".

In column 7, line 52, please add a --,-- after "storage pocket".

In column 7, line 59, please add a --,-- after "storage pocket".

In column 7, line 66, please add a --,-- after “storage pocket”.

In column 8, line 2, please replace “section 302” with --section 312--.

In column 8, line 28, please replace “phone” with --phone 400--.

In column 8, line 28, please add a --,-- after “phone”.